United States Patent
Yamashita et al.

(10) Patent No.: US 9,966,385 B2
(45) Date of Patent: May 8, 2018

(54) SEMICONDUCTOR MEMORY DEVICE

(71) Applicant: Toshiba Memory Corporation, Minato-ku (JP)

(72) Inventors: Hiroki Yamashita, Yokkaichi (JP); Yoshiaki Fukuzumi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 46 days.

(21) Appl. No.: 15/262,258

(22) Filed: Sep. 12, 2016

(65) Prior Publication Data
US 2017/0263632 A1    Sep. 14, 2017

Related U.S. Application Data
(60) Provisional application No. 62/307,967, filed on Mar. 14, 2016.

(51) Int. Cl.
| | | |
|---|---|---|
| *H01L 27/11582* | (2017.01) | |
| *H01L 27/11578* | (2017.01) | |
| *H01L 27/11565* | (2017.01) | |

(52) U.S. Cl.
CPC .. *H01L 27/11582* (2013.01); *H01L 27/11565* (2013.01); *H01L 27/11578* (2013.01)

(58) Field of Classification Search
CPC ......... H01L 27/11582; H01L 27/11565; H01L 27/11578
See application file for complete search history.

(56) References Cited

U.S. PATENT DOCUMENTS

| | | | |
|---|---|---|---|
| 8,237,218 B2 | 8/2012 | Murata et al. | |
| 2010/0171162 A1* | 7/2010 | Katsumata | H01L 27/0688 257/314 |
| 2011/0233648 A1 | 9/2011 | Seol et al. | |
| 2013/0248974 A1* | 9/2013 | Alsmeier | G11C 16/04 257/321 |
| 2014/0014889 A1 | 1/2014 | Shim et al. | |
| 2015/0318301 A1* | 11/2015 | Lee | H01L 29/7926 257/324 |

FOREIGN PATENT DOCUMENTS

| | | |
|---|---|---|
| JP | 2009-272513 | 11/2009 |
| JP | 2011-211200 | 10/2011 |
| JP | 2014-22729 | 2/2014 |

* cited by examiner

*Primary Examiner* — Michele Fan
(74) *Attorney, Agent, or Firm* — Oblon, McClelland, Maier & Neustadt, L.L.P.

(57) ABSTRACT

According to one embodiment, a semiconductor memory device includes a substrate, a stacked body, columnar portions, and first and second interconnection portions. The stacked body includes insulating layers and electrode layers alternately stacked one layer by one layer on the substrate. The columnar portions are provided between the first and second interconnection portions and include a first row having a first columnar portion and a second row having a second columnar portion, the first columnar portion being positioned closest to the first interconnection portion, and the second columnar portion being positioned closest to the second interconnection portion. A distance between the first interconnection portion and the first columnar portion is smaller than a distance between the second interconnection portion and the second columnar portion, and the distance between the second interconnection portion and the second columnar portion is greater than 20 nanometers.

20 Claims, 17 Drawing Sheets

SEMICONDUCTOR MEMORY DEVICE

CROSS-REFERENCE TO RELATED APPLICATION

This application is based upon and claims the benefit of priority from U.S. Provisional Patent Application 62/307,967, filed on Mar. 14, 2016; the entire contents of which are incorporated herein by reference.

FIELD

Embodiments described herein relate generally to a semiconductor memory device.

BACKGROUND

A 3-dimensional structure semiconductor memory device including a memory hole and a silicon body on a substrate has been proposed. The memory hole is formed in a stacked body stacked with a plurality of electrode layers via insulating layers, and the silicon body serving as a channel is provided in the memory hole via a charge storage film. In such a semiconductor memory device, a memory cell including the charge storage film is formed at an intersection between the silicon body and the electrode layer. The electrode layer functions as a gate of the memory cell and forms a word line.

Recently, in such a semiconductor memory device, there is a tendency that high integration progresses miniaturization of elements in the semiconductor memory device, and the widths of both ends of the electrode layer are decreased. As the widths of both ends of the electrode layer are decreased, it is concerned that the resistivity of the electrode layer itself rises and a flow of a current is made harder to the electrode layer, thereby generating problems in the operation of the memory cell.

DETAILED DESCRIPTION

Figure 1:
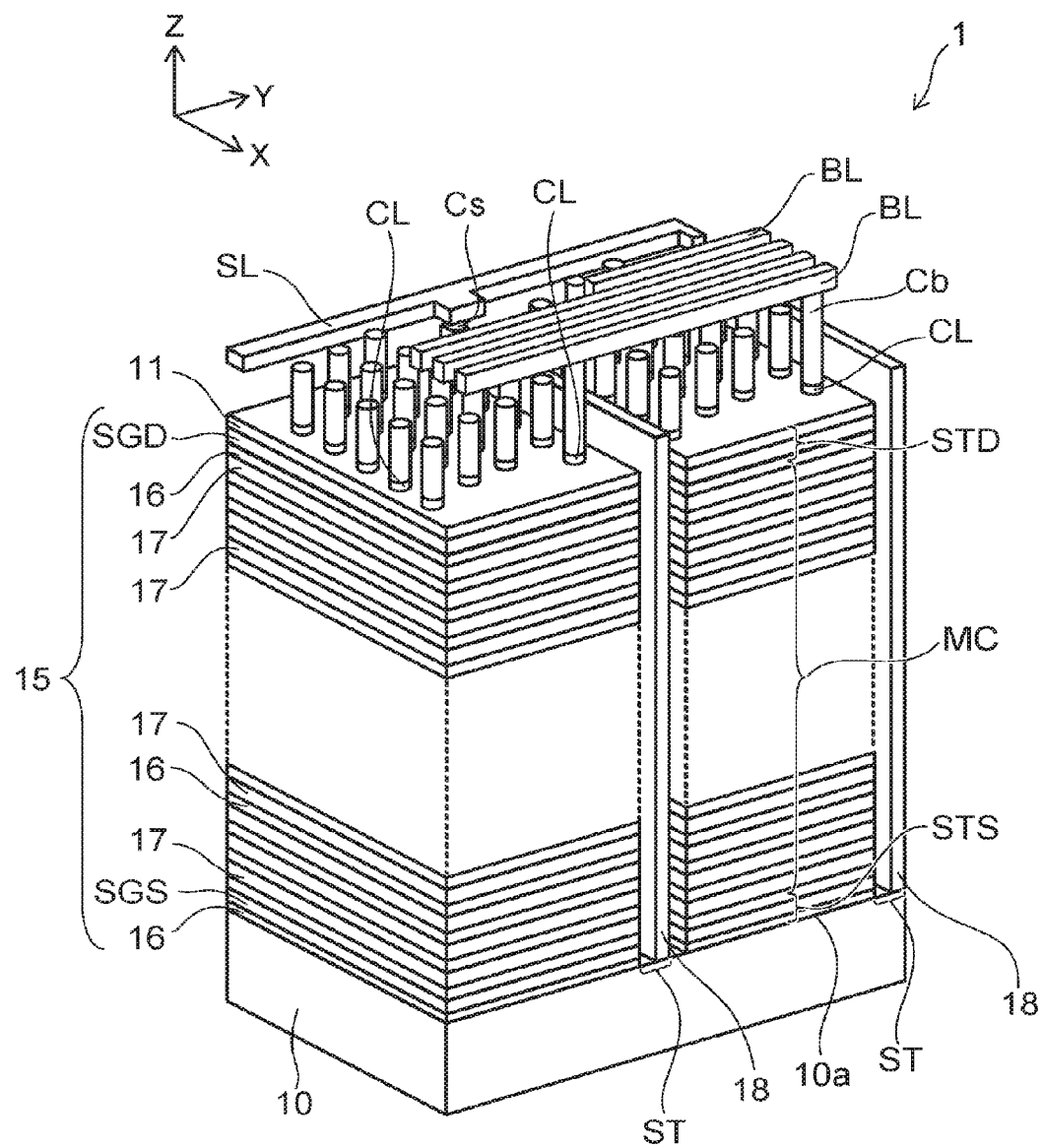
FIG. 1 is a perspective view showing a semiconductor memory device according to a first embodiment.

According to one embodiment, a semiconductor memory device includes a substrate, a stacked body, a plurality of columnar portions, and first and second interconnection portions. The stacked body is provided on the substrate. The stacked body includes a plurality of insulating layers and a plurality of electrode layers alternately stacked one layer by one layer. The plurality of columnar portions are provided in the stacked body and extend in a stacking direction of the stacked body. The first and second interconnection portions are provided in the stacked body, separated from each other, and extend in the stacking direction and a first direction crossing the stacking direction. The plurality of columnar portions are provided between the first and second interconnection portions and include a first row having a first columnar portion and a second row having a second columnar portion, the first columnar portion being positioned closest to the first interconnection portion, and the second columnar portion being positioned closest to the second interconnection portion. A distance between the first interconnection portion and the first columnar portion is smaller than a distance between the second interconnection portion and the second columnar portion, and the distance between the second interconnection portion and the second columnar portion is greater than 20 nanometers.

Various embodiments will be described hereinafter with reference to the accompanying drawings. In the drawings, similar concept is marked with the same reference numerals. The drawings shown below are schematic. For example, for convenience of viewing the drawings, in some drawings, some constituent elements are omitted or the number of the constituent elements is decreased for drawing. The number of the constituent elements and size ratio are not always matched among drawings.

First Embodiment

FIG. 1 shows a memory cell array in a semiconductor memory device 1.

In the semiconductor memory device 1 according to the embodiment, a substrate 10 such as a silicon substrate or the like is provided. Hereinafter, in the specification, for convenience of description, an XYZ orthogonal coordinate system will be used for description. Two directions parallel to an upper surface 10a of the substrate 10 and orthogonal each other are taken as "X-direction" and "Y-direction", and a direction orthogonal to both the X-direction and the Y-direction is taken as "Z-direction".

As shown in FIG. 1, the semiconductor memory device 1 includes a stacked body 15 and a plurality of columnar portions CL. In the semiconductor memory device 1, a plurality of slits ST are formed. The stacked body 15 is provided on the substrate 10. The stacked body 15 includes a plurality of electrode layers 17, a plurality of insulating layers 16, a source side selection gate SGS, and a drain side selection gate SGD. In the stacked body 15, the plurality of insulating layers 16 and the plurality of electrode layers 17 are, for example, stacked alternately one layer by one layer. The number of the electrode layers 17 is arbitrary. A stacking direction of the stacked body 15 is the Z-direction.

The electrode layer 17 includes, for example, a metal such as tungsten (W), titanium (Ti), tantalum (Ta), cobalt (Co), nickel (Ni) or the like. The insulating layer 16 includes, for example, silicon oxide ($SiO_2$).

The source side selection gate SGS is provided on the substrate 10 via the insulating layer 16. The drain side selection gate SGD is provided at an uppermost layer of the stacked body 15. The source side selection gate SGS and the drain side selection gate SGD are formed of, for example, the same material as the material of the electrode layer 17. An insulating film 11 is provided on the stacked body 15. The insulating film 11 includes, for example, silicon oxide.

The columnar portions CL extend in the Z-direction through the stacked body 15. For example, the columnar portion CL is provided cylindrically or elliptic cylindrically, and, in the semiconductor memory device 1, the columnar portions CL are disposed in staggered lattice-like. In the semiconductor memory device 1, the columnar portions CL may be disposed in square lattice-like.

A plurality of bit lines BL extending in the Y-direction are disposed above the columnar portions CL. An upper end portion of the columnar portion CL is connected to one of the bit lines BL via a contact portion Cb.

The slits ST extend in the Z-direction and the X-direction through the stacked body 15. The slits ST divide the stacked body 15 into a plurality of regions arranged along the Y-direction. The region divided by the slits ST is referred to as a "block". One bit line BL is electrically connected to the columnar portions CL so as to select one columnar portion CL from each block.

A plate-like interconnection portion 18 is provided in the slit ST. A plurality of interconnection portions 18 are provided on the substrate 10. The interconnection portion 18 includes, for example, a metal such as tungsten or molybdenum or the like. The plurality of interconnection portions 18 are arranged so as to be separated from each other along the Y-direction, and extend in the X-direction. A bottom end of the interconnection portion 18 contacts the substrate 10.

An insulating side wall 19 extending in the X-direction is further provided in the slit ST. The side wall 19 is provided between the interconnection portion 18 and a structure composed of the stacked body 15, the insulating film 11 and an insulating film 12. The electrode layer 17 is insulated from the interconnection portion 18 by the side wall 19. The side wall 19 includes, for example, silicon oxide.

A source line SL extending in the Y-direction is disposed above the interconnection portion 18. The source line SL is connected to the interconnection portion 18 via a contact portion Cs.

A drain side selection transistor STD is formed at each intersection between the drain side selection gate SGD and the columnar portions CL, and a source side selection transistor STS is formed at each intersection between the source side selection gate SGS and the columnar portions CL. A memory cell is formed at each intersection between the electrode layer 17 and the columnar portions CL.

In each drain side selection transistor STD, the drain side selection gate SGD functions as a gate, and in each source side selection transistor STS, the source side selection gate SGS functions as a gate. In each memory cell MC, the electrode layer 17 functions as a gate, and a part of the columnar portion CL functions as a channel. The plurality of memory cells MC are connected in series between the drain side selection transistor STD and the source side selection transistor STS via the columnar portion CL.

Figure 2:
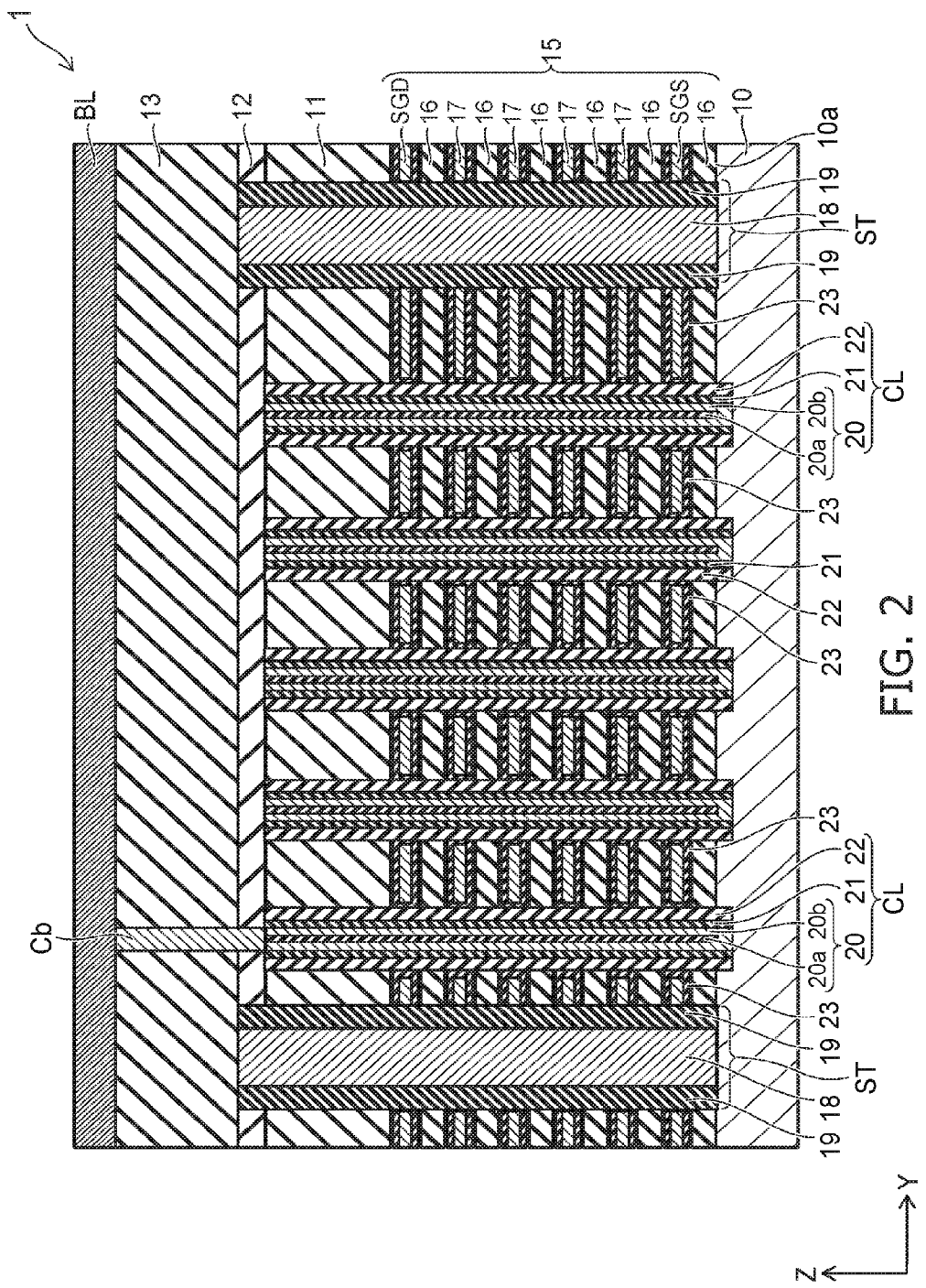
FIG. 2 is a cross-sectional view showing the semiconductor memory device according to the first embodiment.

FIG. 2 shows a Y-Z cross-sectional view of FIG. 1.

As shown in FIG. 2, the columnar portion CL includes a silicon pillar 20 (semiconductor pillar), a tunnel insulating film 21 and a charge storage film 22.

The silicon pillar 20 pierces the insulating film 11 and the stacked body 15, and a bottom end thereof contacts the substrate 10. The silicon pillar 20 includes a cylindrical-shaped insulating core portion 20a positioned within the stacked body 15 and a tubular-shaped silicon body portion 20b provided around the insulating core portion 20a.

The insulating core portion 20a includes, for example, silicon oxide. The silicon body portion 20b includes, for example, silicon. The silicon is, for example, polysilicon made of amorphous silicon that is crystallized. The silicon pillar 20 may not include the insulating core portion 20a.

The tunnel insulating film 21 is provided around the silicon pillar 20. The tunnel insulating film 21 is, for example, a silicon oxide layer of a single layer or an ONO layer stacked with a silicon oxide layer, a silicon nitride layer and a silicon oxide layer. The tunnel insulating film 21 is a potential barrier between the charge storage film 22 and the silicon pillar 20. In the tunnel insulating film 21, when a charge transfers from the silicon pillar 20 to the charge storage film 22 (writing operation) and a charge transfers from the charge storage film 22 to the silicon pillar 20 (erasing operation), the charge tunnels.

The charge storage film 22 is provided around the tunnel insulating film 21. The charge storage film 22 is a film for storing the charge. For example, the charge storage film 22 is formed of a material having a trap site of an electron, for example, silicon nitride ($Si_3N_4$). The memory cell MC including the charge storage film 22 is formed at each intersection between the electrode layers 17 and the silicon body portion 20b of the silicon pillar 20. A threshold value of the memory cell MC changes depending on presence or absence of the charge trapped at the trap site and the trapped charge amount. Thereby, the memory cell MC holds information.

A blocking insulating film 23 is provided around the charge storage film 22. The blocking insulating film 23 is also provided between the insulating layer 16 and the electrode layer 17. The block insulating film 23 is, for example, an aluminum oxide film made of aluminum oxide ($Al_2O_3$), a hafnium oxide film made of hafnium oxide ($HfO_x$), a zirconium oxide film made of zirconium oxide ($ZrO_x$), or a tantalum oxide film made of tantalum oxide ($TaO_x$). The block insulating film 23 may be a stacked film stacked with the oxide films. The block insulating film 23 may be included into the columnar portion CL.

The insulating film 12 is provided on the insulating film 11 and the columnar portions CL. An insulating film 13 is provided on the insulating film 12. The insulating film 12 and the insulating film 13 include, for example, silicon oxide.

The contact portion Cb is provided in the insulating film 12 and the insulating film 13. The silicon pillar 20 of the columnar portion CL is connected to the bit line BL via the contact portion Cb.

Figure 3:
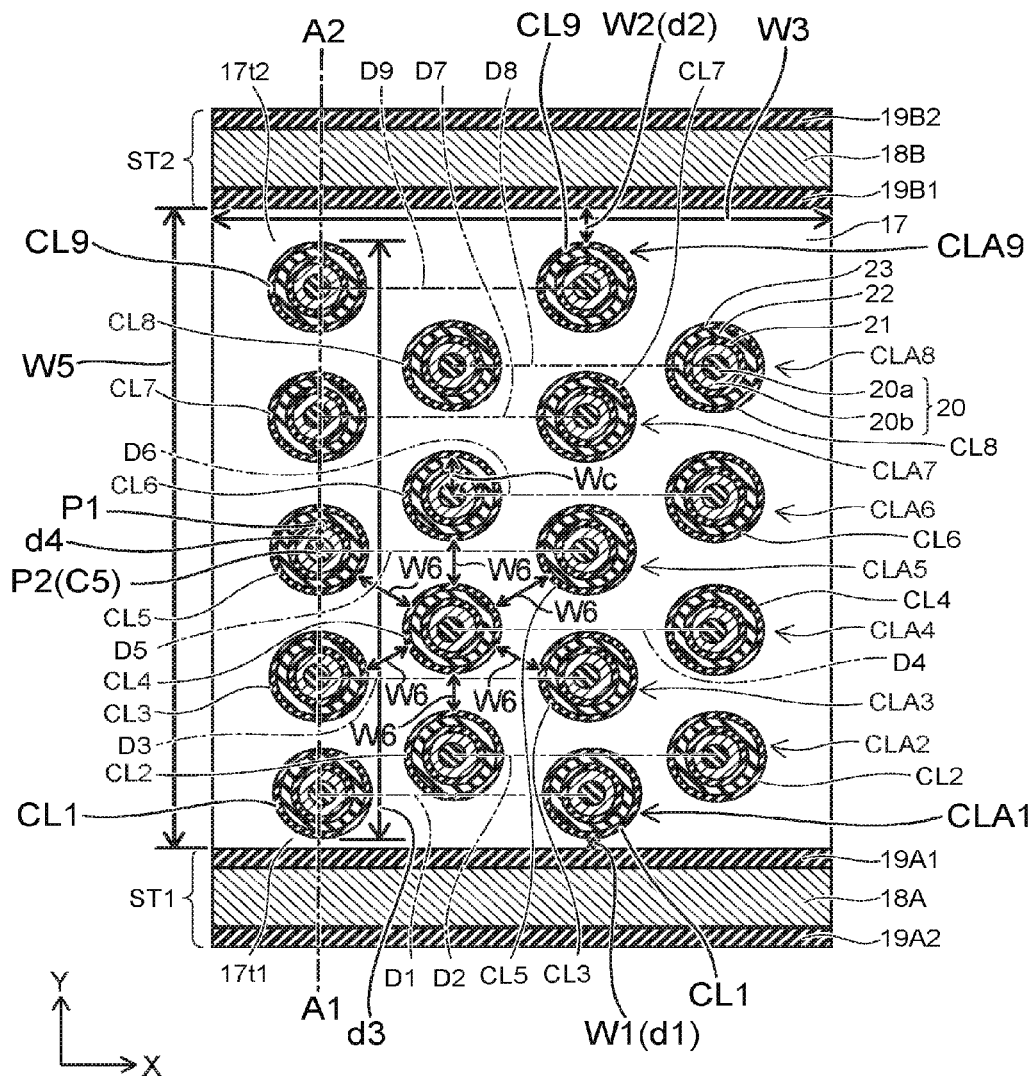
FIG. 3 is a plan view showing a part of the semiconductor memory device according to the first embodiment.
Figure 4:
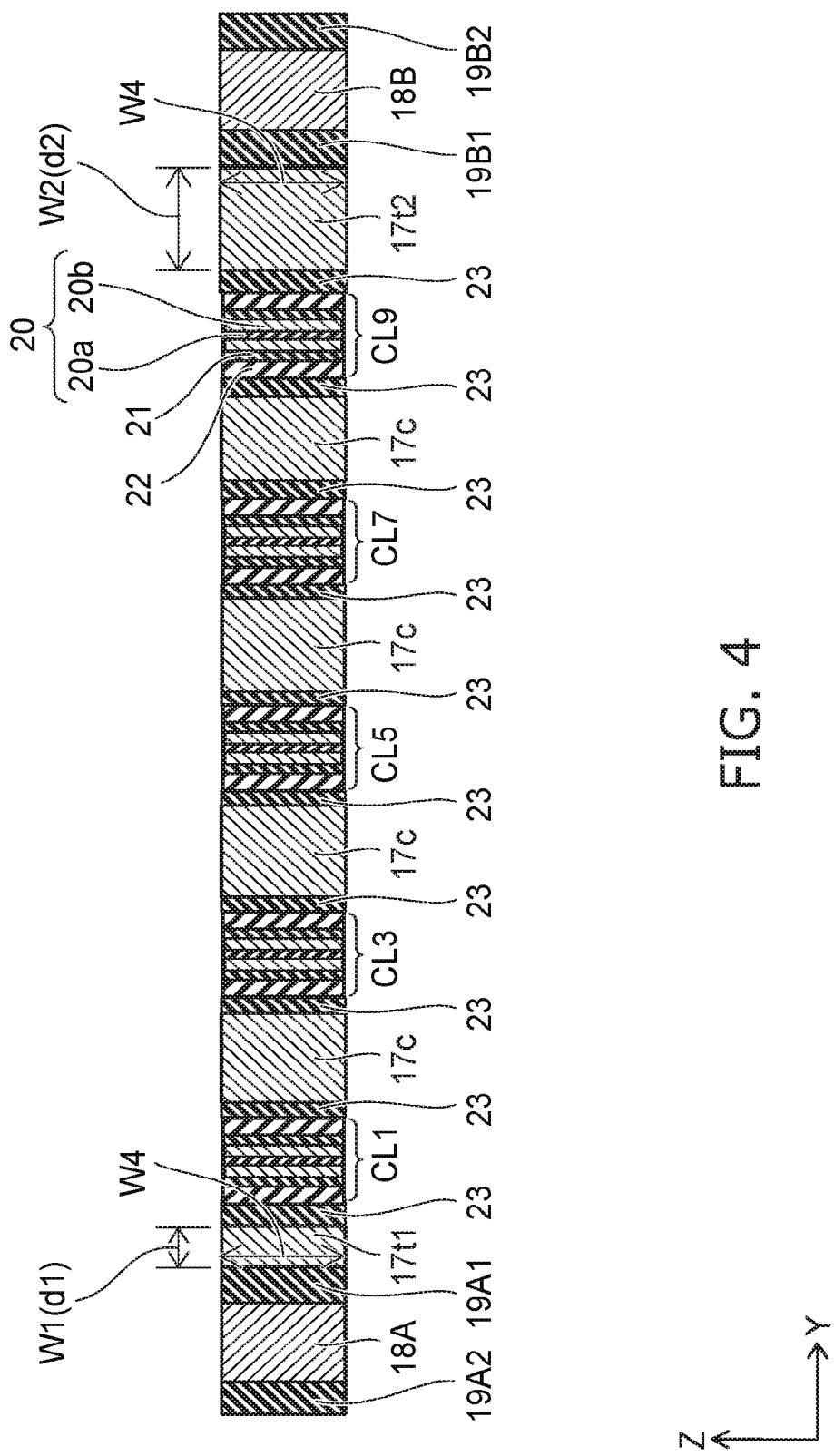
FIG. 4 is a cross-sectional view showing a part of the semiconductor memory device according to the first embodiment.

FIG. 3 is an enlarged plan view extracting the electrode layer 17 between the slits ST. FIG. 4 is a Y-Z cross-sectional view taken along a line A1-A2 of FIG. 3. For convenience of description, in FIG. 3, the hatching of a region representing the electrode layer 17 is omitted.

As shown in FIG. 3 and FIG. 4, the plurality of columnar portions CL are disposed in staggered lattice-like between a slit ST1 and a slit ST2. An interconnection portion 18A, a side wall 19A1 and a side wall 19A2 are provided in the slit ST1 and extend in the X-direction. An interconnection portion 18B, a side wall 19B1 and a side wall 19B2 are provided in the slit ST2 and extend in the X-direction.

In the electrode layer 17, a first row CLA1 to a ninth row CLA9 which are a row of columnar portions CL1 to a row of columnar portions CL9, respectively, are arranged along an extending direction (the X-direction) of the slits ST1 and ST2 or an extending direction (the X-direction) of the electrode layer sandwiched between the slits ST1 and ST2. In the embodiment, the number of the rows arranged in the electrode layer 17 is nine, however the number of the rows is arbitrary.

All of the columnar portions CL1 to CL9 disposed in the first row CLA1 to the ninth row CLA9 may not contribute to the operation of the memory cell MC. For example, the columnar portions CL5 disposed in the fifth row CLA5 may be dummy portions which do not contribute to the operation of the memory cell MC. In this case, the columnar portions CL1 to CL4 disposed in the first row CLA1 to the fourth row CLA4, and the columnar portions CL6 to CL9 disposed in the sixth row CLA6 to the ninth row CLA9 are divided into groups in the Y-direction (upper and lower sides in the drawing). The columnar portions CL of each group are disposed in staggered lattice-like along the X-direction. In the dummy portion, as shown in FIG. 3, the silicon pillar 20, the tunnel insulating film 21 and the charge storage film 22 may be buried. In the dummy portion, an insulating film or the like may be buried.

The columnar portions CL1 of the first row CLA1 to the columnar portions CL9 of the ninth row CLA9 are positioned on virtual straight lines D1 to D9 along the X-direction, respectively.

The columnar portions CL1 on the straight line D1 are positioned such that a distance in the Y-direction to the slit ST1 becomes shortest in the columnar portions CL1 to the columnar portions CL9. That is, in the drawing, the first row CLA1 is a row of the columnar portions CL closest to the slit ST1. Similarly, the columnar portions CL9 on the straight line D9 are positioned such that a distance in the Y-direction to the slit ST2 becomes shortest in the columnar portions CL1 to the columnar portions CL9. That is, the ninth row CLA9 is a row of the columnar portions CL closest to the slit ST2.

Here, for convenience, the electrode layer 17 is defined in three portions. That is, the electrode layer 17 is defined in an end portion 17t1 of the electrode layer 17 between the slit ST1 and the columnar portions CL1 of the first row CLA1, an end portion 17t2 of the electrode layer 17 between the slit ST2 and the columnar portions CL9 of the ninth row CLA9, and a central portion 17c of the electrode layer 17 sandwiched between the end portions 17t1 and 17t2 (refer to FIG. 4).

More specifically, the end portions 17t1 and 17t2 of the electrode layer 17 can be regarded as a substantially rectangular parallelepiped having widths (lengths) in the X-direction, the Y-direction and the Z-direction. The width (W3, not shown in FIG. 4) in the X-direction is a width equal to a total length of the electrode layer 17 in the X-direction. The widths (W1, W2) of the end portions 17t1 and 17t2 of the electrode layer 17 in the Y-direction are widths corresponding to a shortest distance (d1, d2) from ends of the slits ST1 and ST2 to the block insulating films 23 of the columnar portions CL of the rows (the first and ninth rows of the embodiment) closest to the slits ST1 and ST2. The width (W4, refer to FIG. 4) in the Z-direction corresponds to a thickness of the electrode layer 17. The central portion 17c of the electrode layer 17 is a portion of the electrode layer 17 except for the end portions 17t1 and 17t2 of the electrode layer 17.

The electrode layer 17 functions as a word line for the memory cell MC of the columnar portion CL. When a voltage is supplied to the electrode layer 17 as the word line during a memory operation, the central portion 17c and the end portions 17t1, 17t2 of the electrode layer 17 are current paths. The central portion 17c which occupies a large portion of the electrode layer 17 contributes to the memory operation as a main current path at supplying the voltage to the memory cell MC of the columnar portion CL positioned within the electrode layer 17. On the other hand, the end portions 17t1 and 17t2 of the electrode layer 17 are also current paths and contribute to the memory operation. In the case where miniaturization of the memory cell MC in the X-direction and the Y-direction, particularly, the Y-direction further progresses, the influence of the end portions 17t1 and 17t2 of the electrode layer 17 cannot be ignored.

As shown in FIG. 3 and FIG. 4, in the embodiment, a width W2 of the end portion 17t2 is greater than a width W1 of the end portion 17t1. The width W1 of the end portion 17t1 is 20 nanometers or less. The width W2 of the end portion 17t2 is greater than 20 nanometers. In view of high integration of the semiconductor memory device 1, the width W2 is preferably smaller than 40 nanometers. For example, when a width of the columnar portion CL is represented by Wc, the width W2 is greater than Wc/6.

By setting the width W2 greater than the width W1, a positional point P1 and a positional point P2 described later are not overlapped on the electrode layer 17. When a width of the electrode layer 17 in the Y-direction (that is, a distance between the slits ST1 and ST2) is represented by W5, the positional point P1 is a point which is positioned in the middle (W5/2) of the width (the distance). Here, the positional point P1 is also a point which is positioned in the middle of a distance between the interconnection portion 18A and the interconnection portion 18B.

When a maximum distance in the Y-direction from an end of the columnar portion CL1 to an end of the columnar portion CL9 is represented by d3, the positional point P2 is a point which is positioned at a distance of d3/2 from the columnar portion CL1 in the Y-direction. The positional point P2 corresponds to a center C5 of the columnar portion CL5. Here, the positional point P2 is also a point which is positioned in the middle of a distance between the straight line D1 and the straight line D9. The value of the distance d3 corresponds to a vale obtained by subtracting a sum of the width W1 and the width W2 from the width W5.

In view of the alignment of the columnar portions CL to the electrode layer 17, a distance d4 between the positional point P1 and the positional point P2 is desirably 20 nanometers or more. In this case, a difference between the width W1 of the end portion 17t1 and the width W2 of the end portion 17t2 is 20 nanometers or more.

In FIG. 3, when a distance between the columnar portions CL adjacent to each other at a shortest distance is represented by W6, for example, the distance W6 is greater than the width W1 and the width W2.

For example, the columnar portions CL adjacent to the columnar portion CL4 of the fourth row CLA4 are the columnar portion CL2 of the second row CLA2, the columnar portion CL6 of the sixth row CLA6, two columnar portions CL3 of the third row CLA3, and two columnar portions CL5 of the fifth row CLA5, which are arranged around the columnar portion CL4.

Hereinafter, a method for manufacturing the semiconductor memory device 1 will be described.

FIG. 5 to FIG. 9 are cross-sectional views showing a method for manufacturing the semiconductor memory device according to the first embodiment. The cross-sections of FIG. 5 to FIG. 9 correspond to the cross-section of FIG. 2 and show a portion lower than the insulating film 13.

Figure 5:
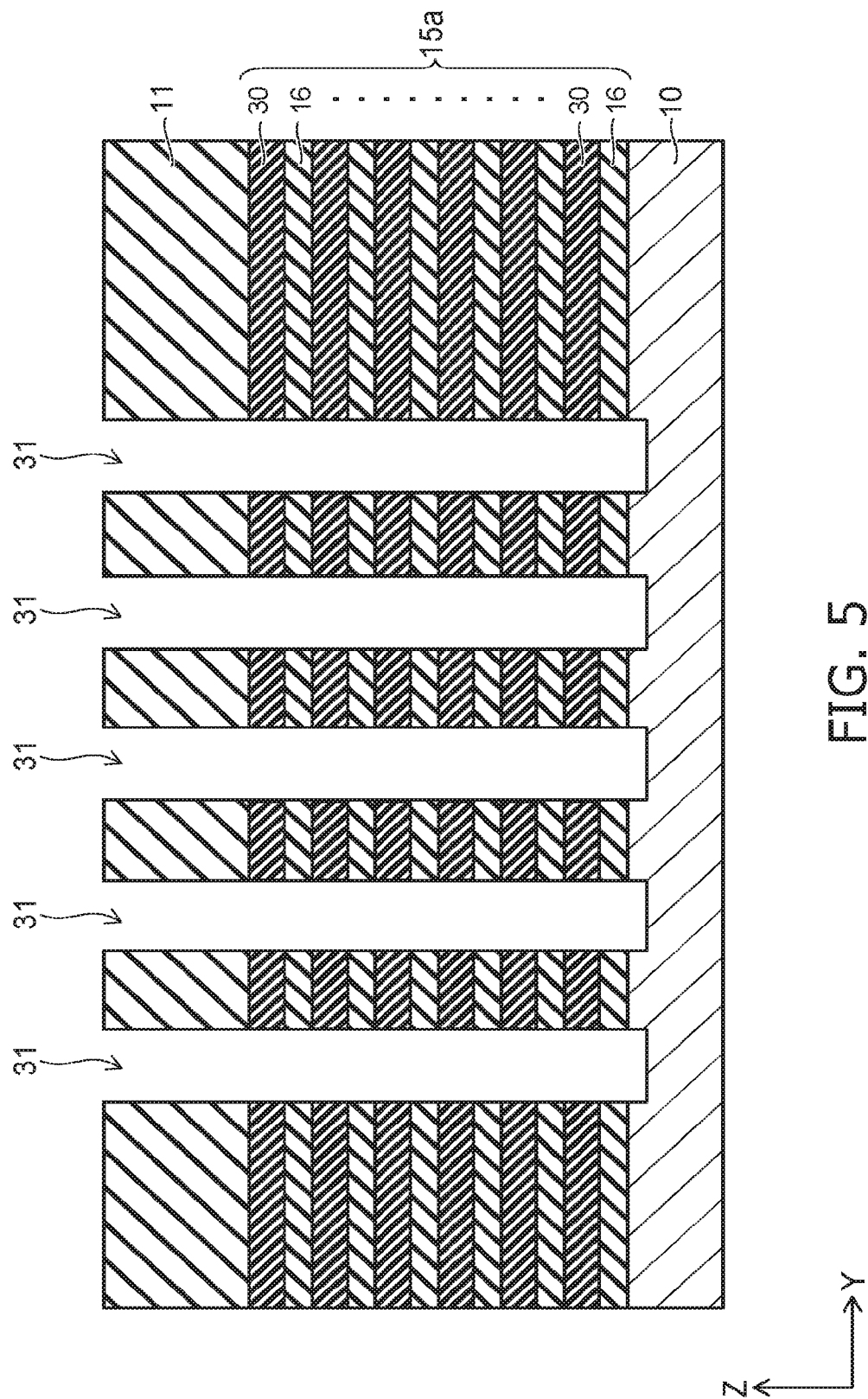
FIG. 5 to FIG. 9 are cross-sectional views showing a method for manufacturing the semiconductor memory device according to the first embodiment.

Firstly, as shown in FIG. 5, a stacked body 15a is formed on the substrate 10 by alternately stacking the insulating layers and sacrifice films 30 along the Z-direction using, for example, a CVD (Chemical Vapor Deposition) method. For example, the insulating layers 16 are formed of silicon oxide. The sacrifice films 30 are formed of a material that an etching selection ratio is obtained to the insulating layers 16, for example, formed of silicon nitride. Subsequently, the insulating film 11 is formed on the stacked body 15a.

Subsequently, a plurality of memory holes 31 are formed in the insulating film 11 and the stacked body 15a by, for example, a photolithography method and RIE (Reactive Ion Etching). The memory holes 31 extend in the Z-direction, pierce the insulating film 11 and the stacked body 15a, and reach the substrate 10. For example, the memory holes 31 having a circular shape are disposed in staggered lattice-like viewed in the Z-direction.

Figure 6:
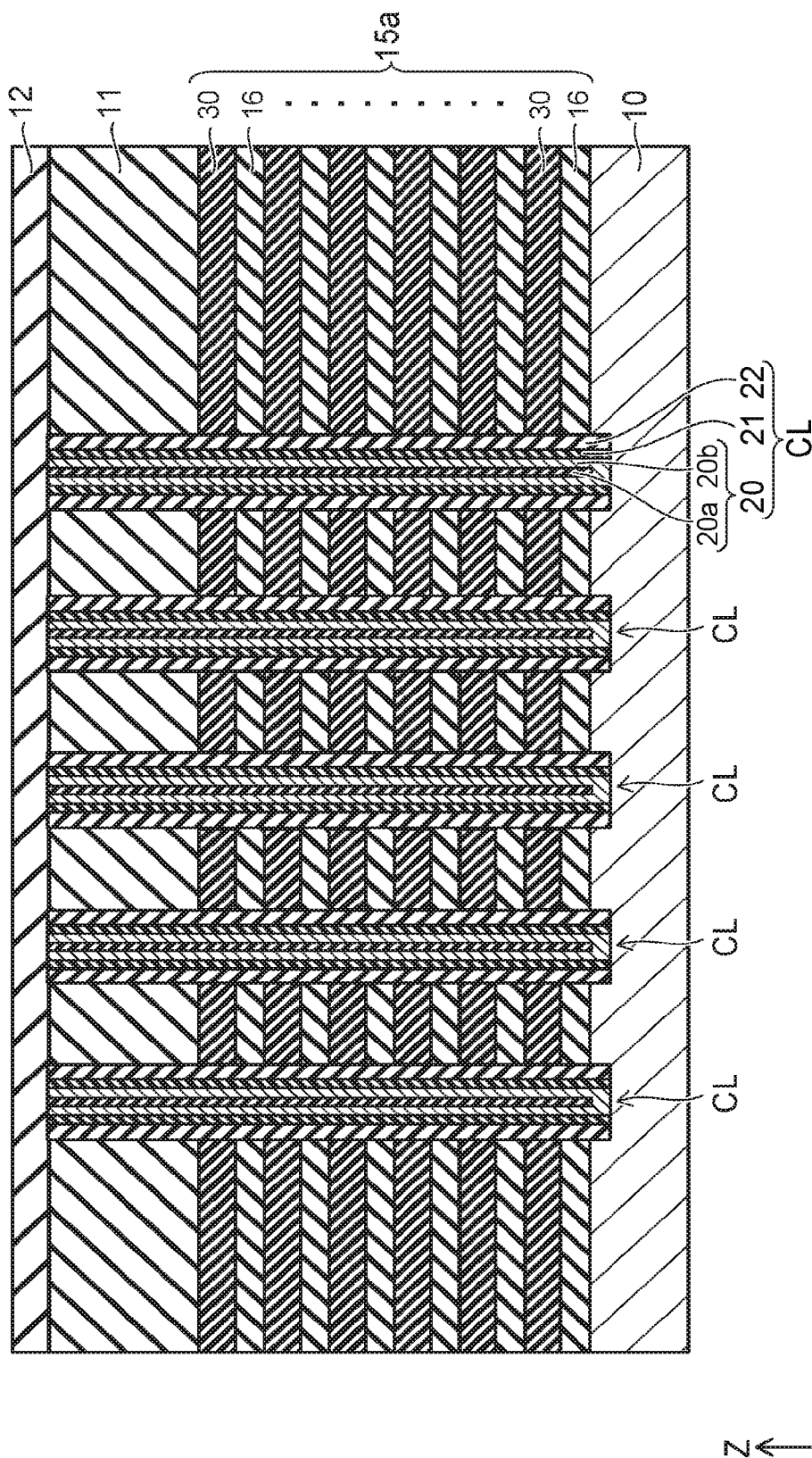

Next, as shown in FIG. 6, the charge storage film 22, the tunnel insulating film 21, the silicon body portion 20b and the insulating core portion 20a are formed in the memory hole 31. Thereby, the plurality of columnar portions CL, each of which including the silicon pillar 20, are formed. By, for example, the CVD method, silicon nitride is deposited on an inner surface of the memory hole 31 to form the charge storage film 22, and silicon oxide is deposited to form the tunnel insulating film 21. Thereafter, the tunnel insulating film 21 and the charge storage film 22 are removed from a bottom surface of the memory hole 31 by performing the RIE, and the substrate 10 is exposed. Subsequently, after silicon is deposited to form the silicon body portion 20b, silicon oxide is deposited to form the insulating core portion 20a. A bottom end of the silicon body portion 20b contacts the substrate 10. Subsequently, the insulating film 12 is formed on the insulating film 11 and the columnar portions CL.

Figure 7:
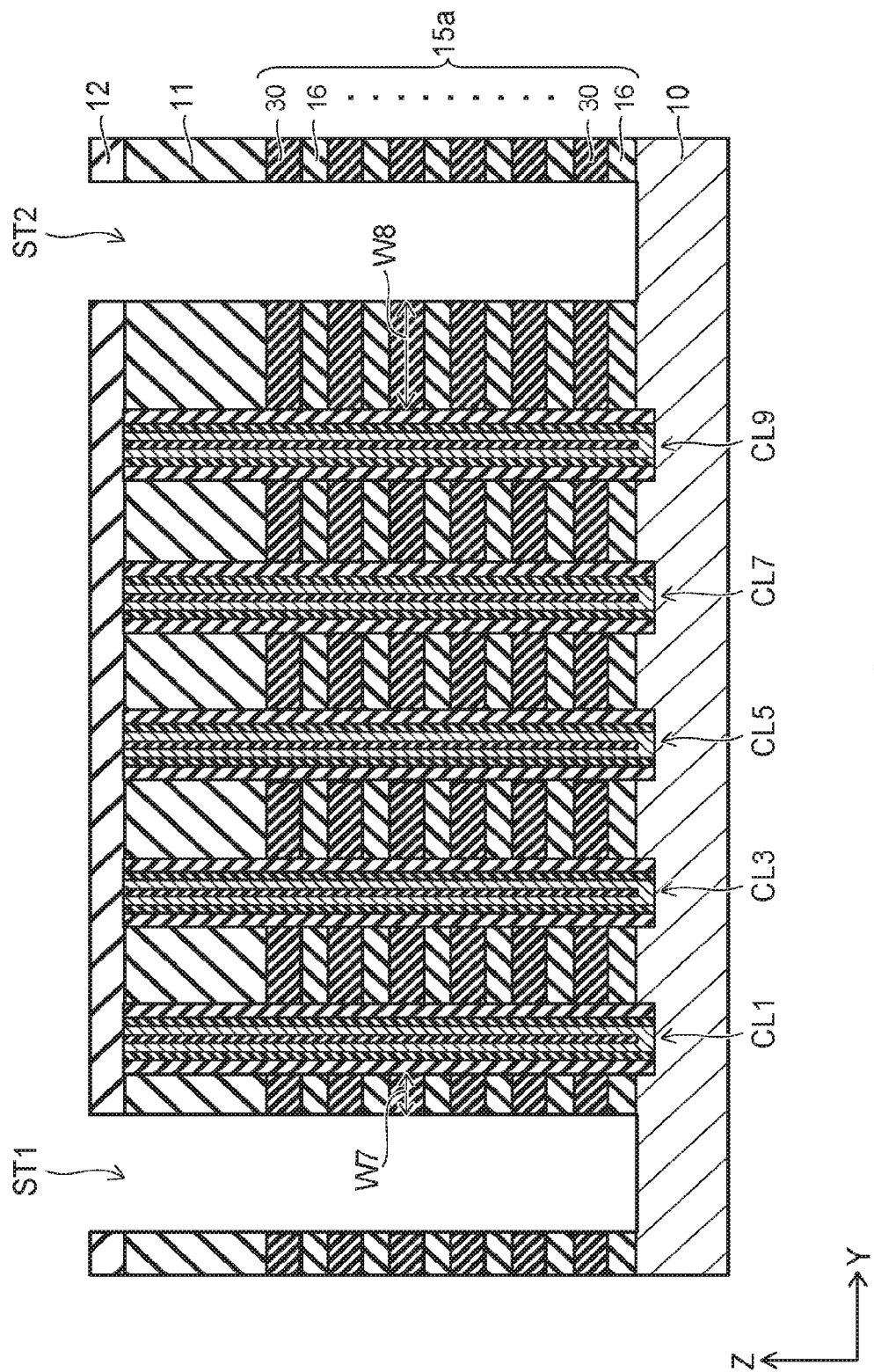

Next, as shown in FIG. 7, the slits ST1 and ST2 extending in the X-direction are formed in the stacked body 15a by, for example, the photolithography method and an anisotropic etching such as the RIE or the like. The slits ST1 and ST2 are pierced through the insulating film 12, the insulating film 11 and the stacked body 15a. Thereby, the stacked body 15a is divided into a plurality of stacked bodies extending in the X-direction by the slits ST1 and ST2. In the case of arranging the first row CLA1 to the ninth row CLA9 which are the row of the columnar portions CL1 to the row of the columnar portions CL9, respectively, the columnar portions CL1, CL3, CL5, CL7 and CL9 are disposed from the slit ST1 toward the slit ST2 in the Y-Z cross-section shown in FIG. 7.

A width W8 of the sacrifice film 30 in the Y-direction, which is positioned between the slit ST2 and the columnar portion CL9 is greater than a width W7 of the sacrifice film 30 in the Y-direction, which is positioned between the slit ST1 and the columnar portion CL1. The slits ST1 and ST2 are formed in the stacked body 15a so that the width W8 is greater than the width W7.

Figure 8:
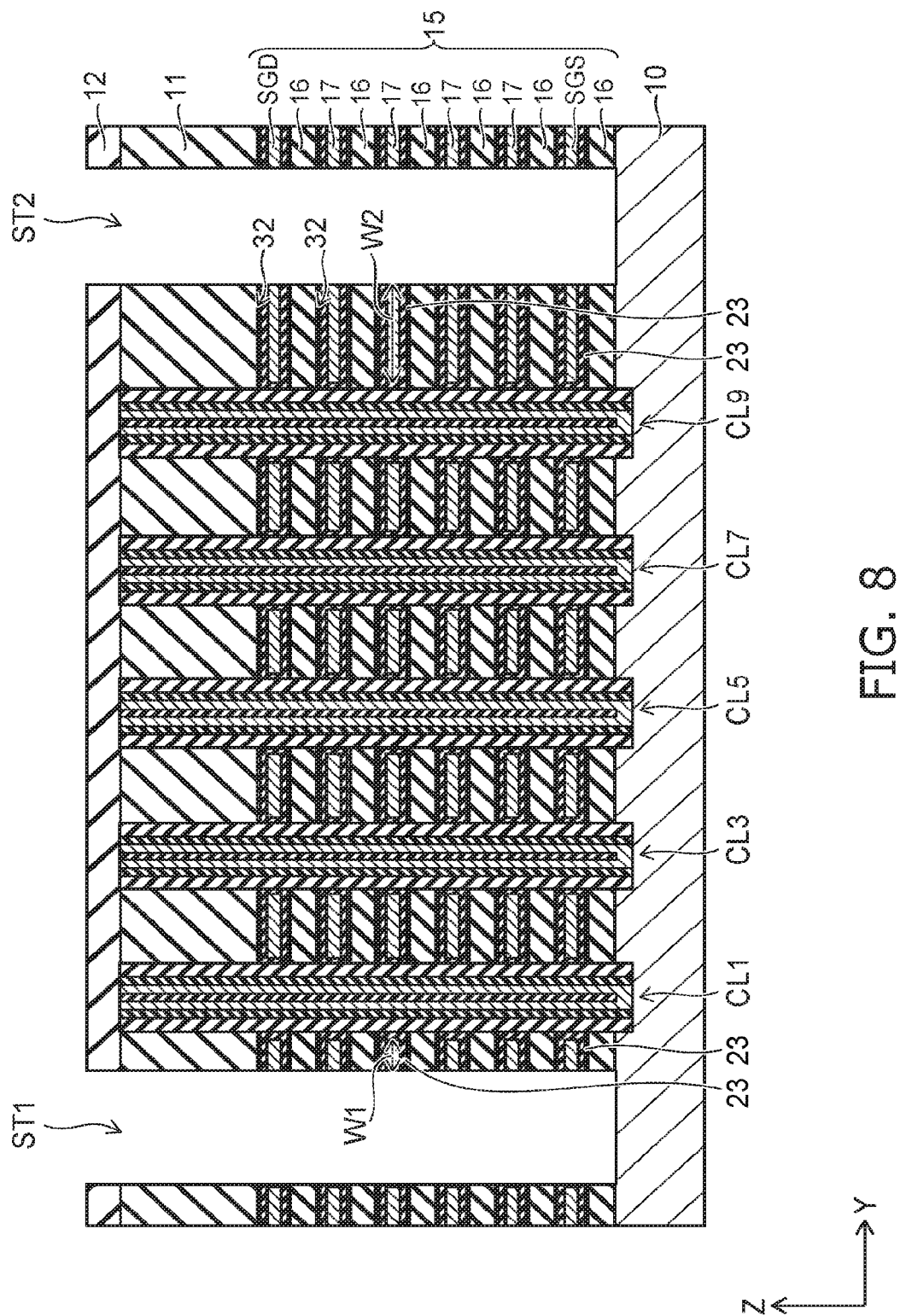

Next, as shown in FIG. 8, the sacrifice films 30 are removed by performing a wet etching via the slits ST1 and ST2. For example, in the case of forming the sacrifice films 30 of silicon nitride, phosphoric acid is used for etchant of the wet etching, and thermos-phosphoric acid is used for processing. Cavities 32 are formed by removing the sacrifice films 30 via the slits ST1 and ST2.

Subsequently, aluminum oxide is deposited all over to form the blocking insulating film 23. The blocking insulating film 23 is formed around the charge storage film 22 and on the insulating layer 16. Thereafter, a metal such as tungsten or the like is deposited in the cavities 32 to form the electrode layer 17, the source side selection gate SGS and the drain side selection gate SGD. Thereby, the stacked body 15 is formed.

The width W2 of the electrode layer 17 in the Y-direction, which is positioned between the slit ST2 and the columnar portion CL9 is greater than the width W1 of the electrode layer 17 in the Y-direction, which is positioned between the slit ST1 and the columnar portion CL1.

Figure 9:
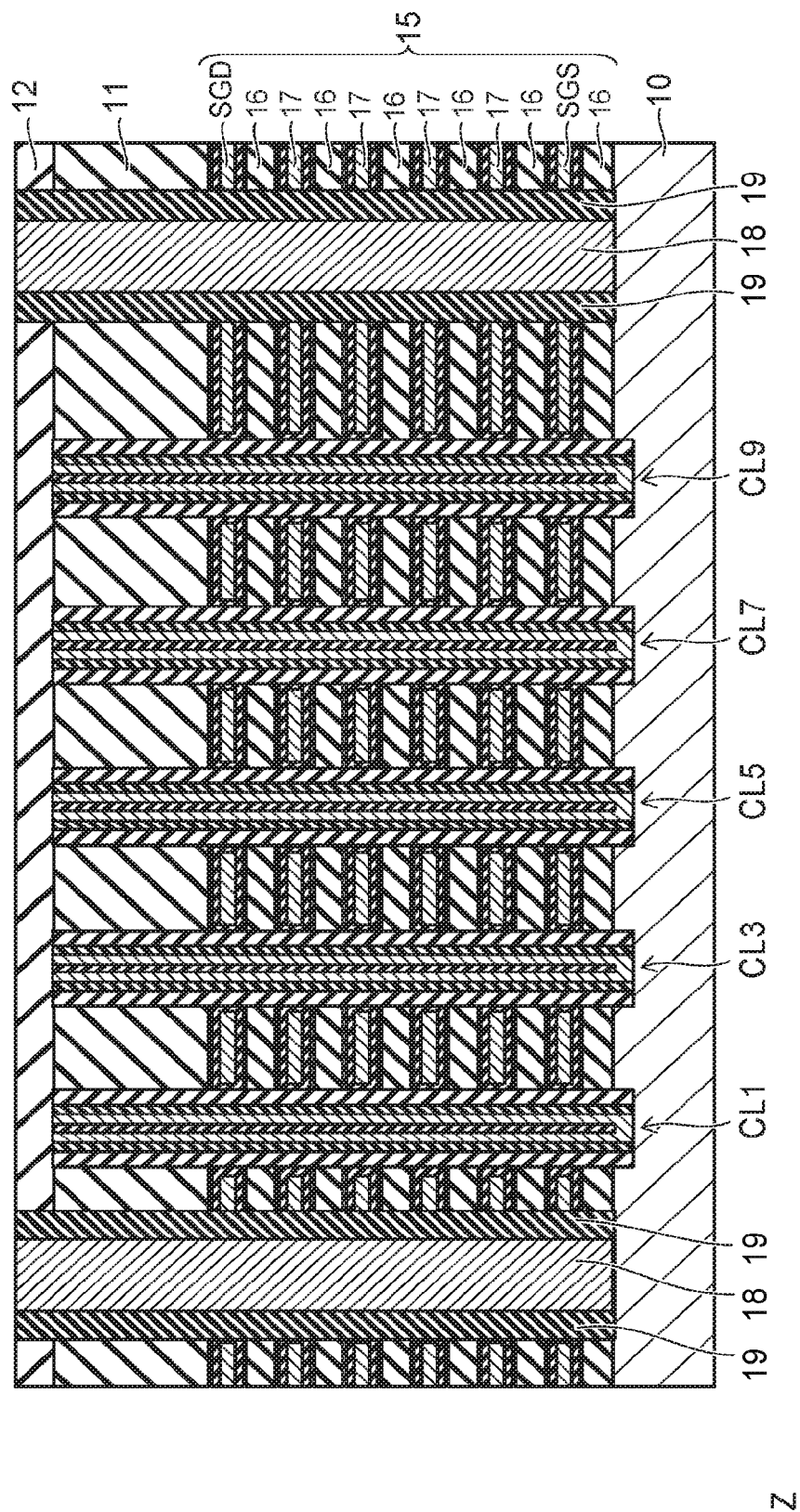

Next, as shown in FIG. 9, silicon oxide is deposited on side surfaces of the slits ST1 and ST2 to form the side walls 19. Thereafter, a metal such as tungsten or the like is deposited in the slits ST1 and ST2 to form the interconnection portions 18.

Thereafter, the insulating film 13 is formed on the insulating film 12, and the contact portion Cb is formed by burying tungsten or the like in a contact hole piercing the insulating films 12 and 13. Subsequently, the bit line BL is formed on the insulating film 13.

In this manner, the semiconductor memory device 1 according to the first embodiment is manufactured.

Hereinafter, the effects of the first embodiment will be described.

Figure 10:
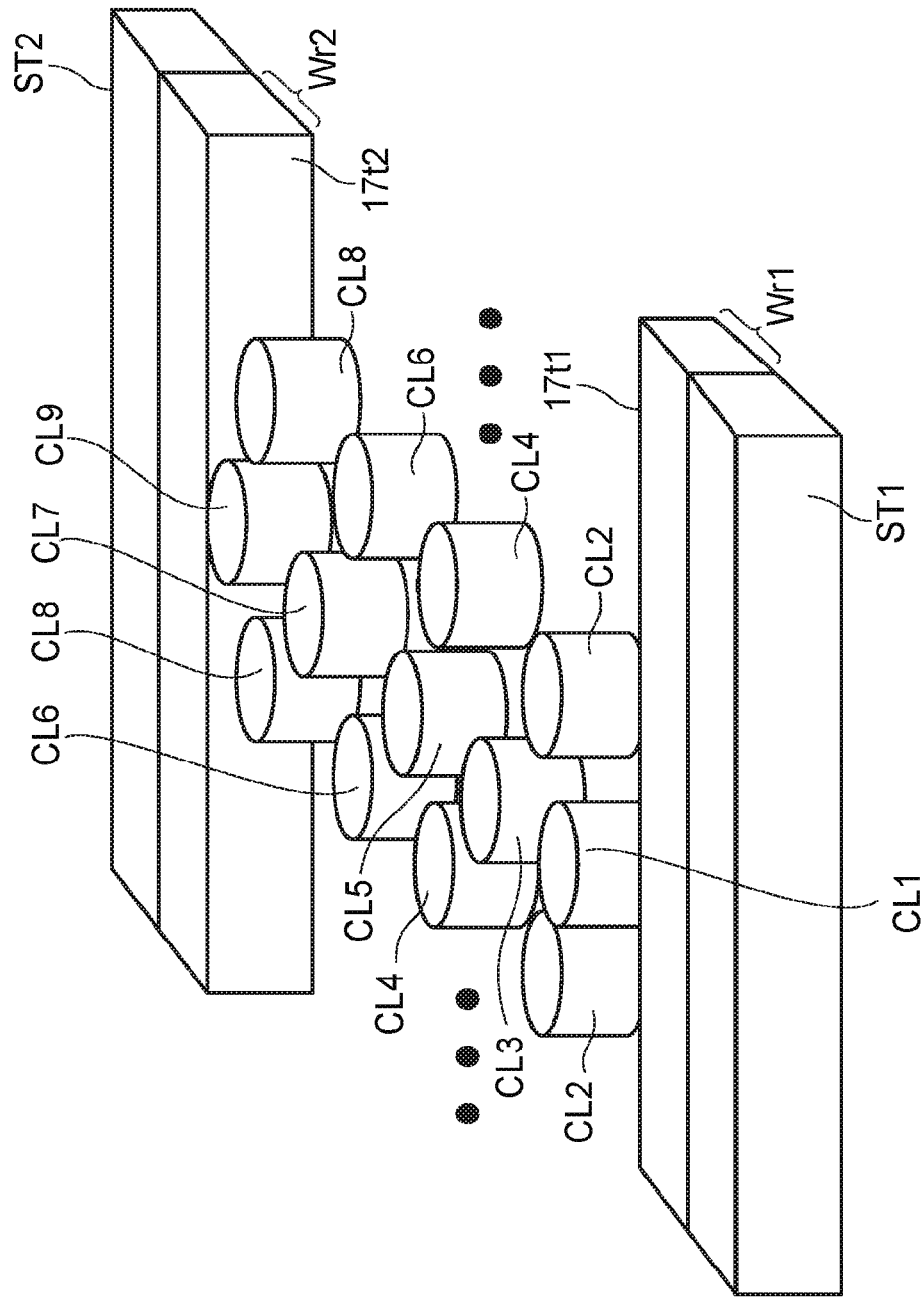
FIG. 10 is a perspective view showing a part of a semiconductor memory device according to a reference example.
Figure 11:
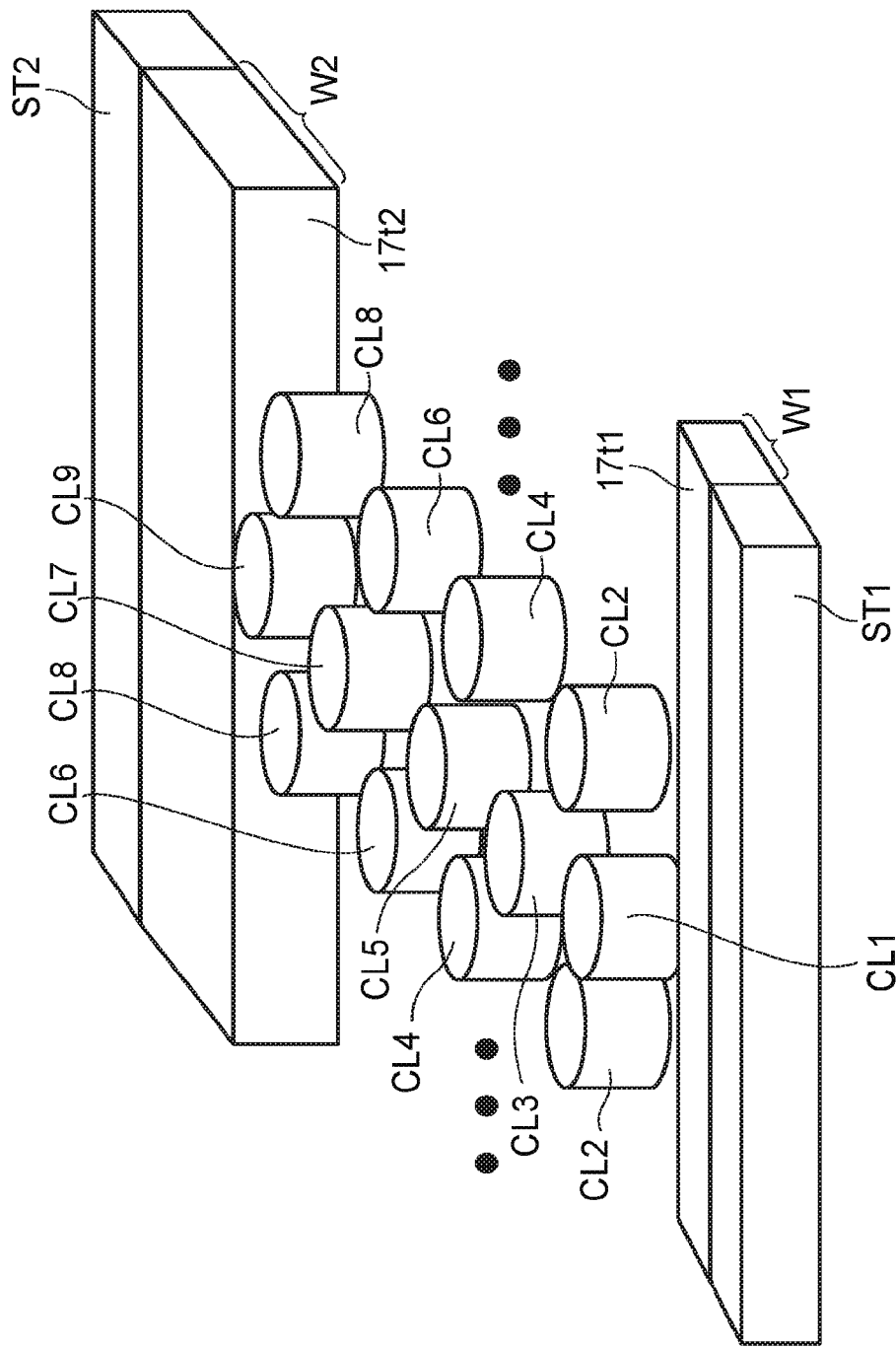
FIG. 11 is a perspective view showing a part of the semiconductor memory device according to the first embodiment.

FIG. 10 and FIG. 11 are perspective views of a semiconductor memory device describing the effects. FIG. 10 shows a reference example and FIG. 11 shows the semiconductor memory device 1 according to the first embodiment.

As shown in FIG. 11, in the semiconductor memory device 1 of the first embodiment, the plurality of columnar portions CL are disposed between the slits ST1 and ST2 so that the width W2 of the electrode layer 17 between the slit ST2 and the columnar portion CL9 having the shortest distance to the slit ST2 becomes greater than the width W1 of the electrode layer 17 between the slit ST1 and the columnar portion CL1 having the shortest distance to the slit ST1. When the plurality of columnar portions CL are provided in this manner, a flow of a current is made easier by ensuring the current paths in the electrode layer 17. For example, since the flow of the current is made easier to the electrode layer 17 in the writing operation, it is possible to write data to a desired memory cell MC in a short time. Therefore, it is possible to suppress problems from being generated in the operation of the memory cell MC by making a flow of a current harder to the electrode layer 17.

Here, in a recent semiconductor memory device, a multilayer wiring structure is used, in which a plurality of wirings are provided 3-dimensionally. In such a multilayer wiring structure, normally, each wiring is often formed of a metal material such as tungsten or aluminum, and there is a tendency that a width of each wiring shrinks. However, when the width of the wiring is reduced, a phenomenon that the resistivity of the wire itself rises and a flow of a current is made harder to the wiring is likely to occur. Such a phenomenon is referred to as a fine line effect.

This is caused by when the width of the wiring is reduced, an inelastic scattering due to many of electrons in the metal occurs at a surface of the wiring before a lattice scattering due to the electrons occurs, as a result, the resistance of the wiring increases beyond the reduction rate of the cross-section of the wiring.

For example, when the width of the wiring is 20 nanometers or less, by the fine line effect, the resistivity of the wire itself remarkably rises. This is because the mean free path of the electrons in the metal is about 20 nanometers, and the number of the electrons inelastic scattering at the surface of the wiring is increased when the width of the wiring is 20 nanometers or less, thereby making a flow of a current harder to the wiring.

In the case where the electrode layer 17 is formed of a metal material such as tungsten, as the widths of both end portions 17t1 and 17t2 of the electrode layer 17 are reduced, a phenomenon that the resistivity of each of the end portions 17t1 and 17t2 rises is likely to occur.

For example, in the case where a predetermined number of columnar portion CL is arranged in the electrode layer 17, as shown in the reference example of FIG. 10, it is normal to set a width Wr1 (a portion corresponding to the width W1 (d1) of FIG. 3) of the electrode layer 17 between the slit ST1 and the columnar portion CL1 to be the same as a width Wr2 (a portion corresponding to the width W2 (d2) of FIG. 3) of the electrode layer 17 between the slit ST2 and the columnar portion CL9. In this case, depending on the number of the columnar portions CL and the manner of disposing the columnar portions CL, both the width Wr1 of the end portion 17t1 and the width Wr2 of the end portion 17t2 of the electrode layer 17 are likely to be reduced so as to maximize the density of the columnar portion CL to the electrode layer 17. For example, when the widths Wr1 and Wr2 are 20 nanometers or less, the resistivities of the end portions 17t1 and 17t2 rise by the fine line effect. Thereby, a flow of a current is made harder to the end portions 17t1 and 17t2. Since the end portions 17t1 and 17t2 are portions of the electrode layer 17 (the word line), a flow of a current is made harder to the electrode layer 17.

In the first embodiment, as described above, the width W2 of the electrode layer 17 between the slit ST2 and the columnar portion CL9 is greater than the width W1 of the electrode layer 17 between the slit ST1 and the columnar portion CL1 (refer to FIG. 11).

When the plurality of columnar portions CL are provided such that the width W2 of the end portion 17t2 is greater than the width W1 of the end portion 17t1, it is possible to set the width W2 of the end portion 17t2 to the extent that the fine line effect does not occur in the end portion 17t2. By the width W2 of the end portion 17t2 being greater than 20 nanometers, the rise of the resistivity of the end portion 17t2 is suppressed, and a flow of a current is made easier to the end portion 17t2. As compared with the case (the reference example of FIG. 10) where the resistivities of the end portions 17t1 and 17t2 rise by the fine line effect, a flow of a current is made easier to the electrode layer 17.

According to the first embodiment described above, the semiconductor memory device which suppresses problems from being generated in the operation of the memory cell can be provided.

Hereinafter, the variation of the first embodiment will be described.

Figure 12:
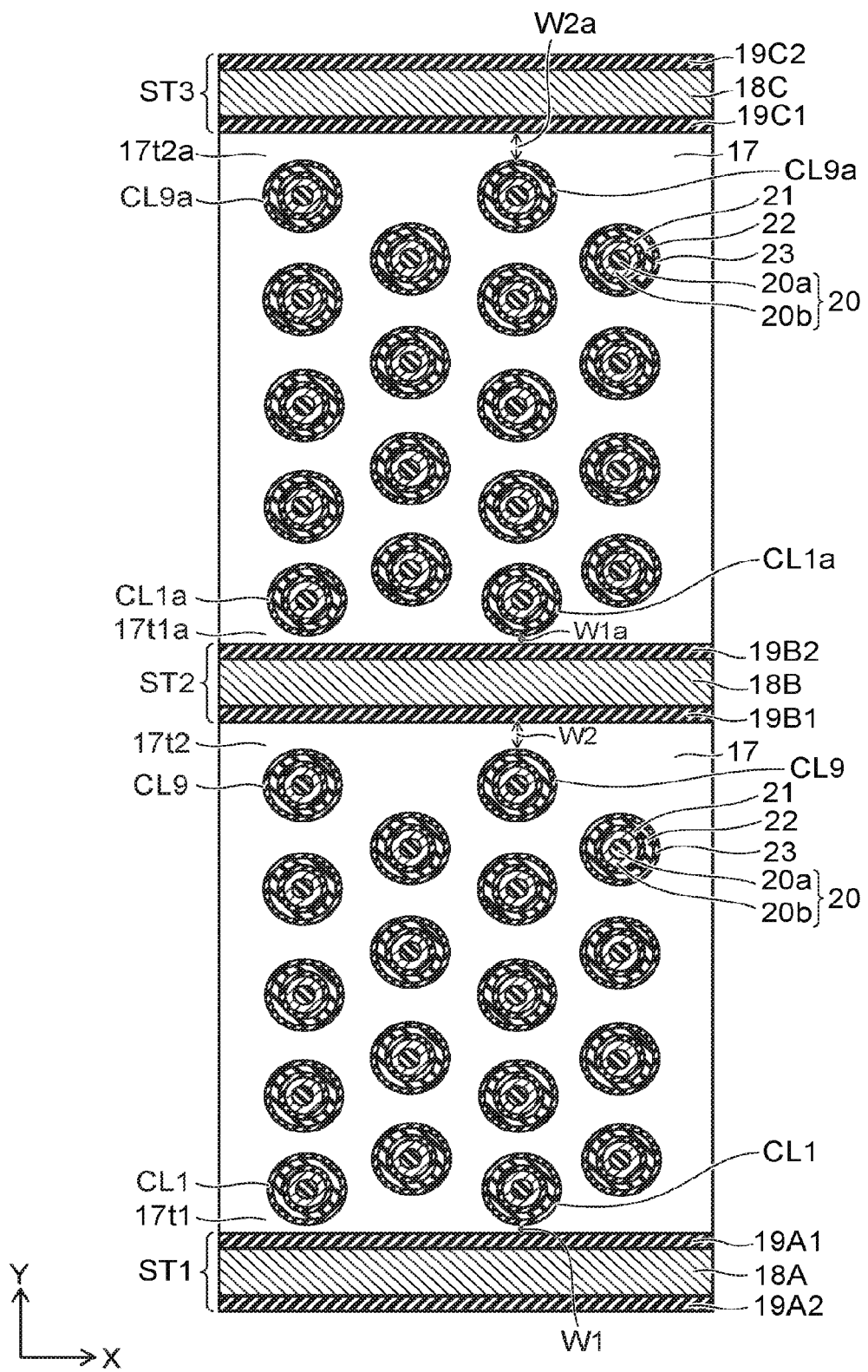
FIG. 12 is a plan view showing a part of a semiconductor memory device according to a variation of the first embodiment.

FIG. 12 is an enlarged plan view extracting the electrode layer 17 between the slits ST. For convenience of description, in FIG. 12, the hatching of a region representing the electrode layer 17 is omitted.

As shown in FIG. 12, the plurality of columnar portions CL are disposed between the slit ST1 and the slit ST2, and between the slit ST2 and a slit ST3. The interconnection portion 18A, the side wall 19A1 and the side wall 19A2 are provided in the slit ST1. The interconnection portion 18B, the side wall 19B1 and the side wall 19B2 are provided in the slit ST2. An interconnection portion 18C, a side wall 19C1 and a side wall 19C2 are provided in the slit ST3.

Between the slit ST1 and the slit ST2, the plurality of columnar portions CL are disposed in the electrode layer 17 as the disposition of the columnar portions CL of FIG. 3. Between the slit ST2 and the slit ST3, the plurality of columnar portions CL are disposed in the electrode layer 17 as the disposition of the columnar portions CL of FIG. 3. That is, the plurality of columnar portions CL are disposed so as to repeat the disposition of the columnar portions CL of FIG. 3 in the Y-direction between the slits ST.

The columnar portions CL1 are positioned such that a distance in the Y-direction to the slit ST1 becomes shortest in the plurality of columnar portions CL disposed between the slit ST1 and the slit ST2. The columnar portions CL9 are positioned such that a distance in the Y-direction to the slit ST2 becomes shortest in the plurality of columnar portions CL disposed between the slit ST1 and the slit ST2.

The end portion 17t1 of the electrode layer 17 is provided between the plurality of columnar portions CL1 and the slit ST1, and the end portion 17t2 of the electrode layer 17 is provided between the plurality of columnar portions CL9 and the slit ST2. As shown in FIG. 12, in the embodiment, the width W2 of the end portion 17t2 in the Y-direction is greater than the width W1 of the end portion 17t1 in the Y-direction. The width W1 of the end portion 17t1 is 20 nanometers or less. The width W2 of the end portion 17t2 is greater than 20 nanometers.

A plurality of columnar portions CL1a are positioned such that a distance in the Y-direction to the slit ST2 becomes shortest in the plurality of columnar portions CL disposed between the slit ST2 and the slit ST3. A plurality of columnar portions CL9a are positioned such that a distance in the Y-direction to the slit ST3 becomes shortest in the plurality of columnar portions CL disposed between the slit ST2 and the slit ST3.

An end portion 17t1a of the electrode layer 17 is provided between the plurality of columnar portions CL1a and the slit ST2, and an end portion 17t2a of the electrode layer 17 is provided between the plurality of columnar portions CL9a and the slit ST3. As shown in FIG. 12, in the embodiment, a width W2a of the end portion 17t2a in the Y-direction is greater than a width W1a of the end portion 17t1a in the Y-direction. The width W1a of the end portion 17t1a is 20 nanometers or less. The width W2a of the end portion 17t2a is greater than 20 nanometers.

Second Embodiment

Figure 13:
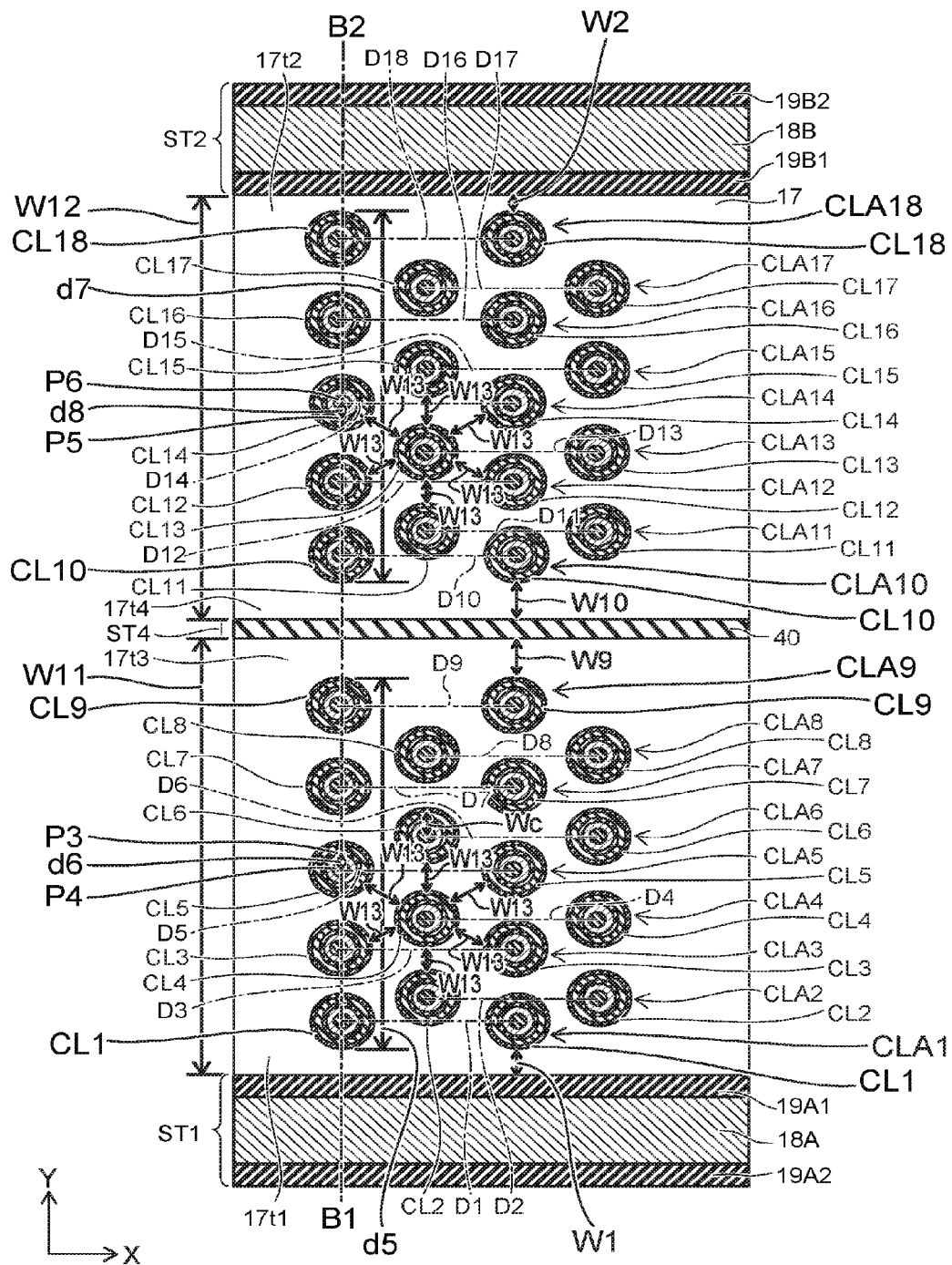
FIG. 13 is a plan view showing a part of a semiconductor memory device according to a second embodiment.
Figure 14:
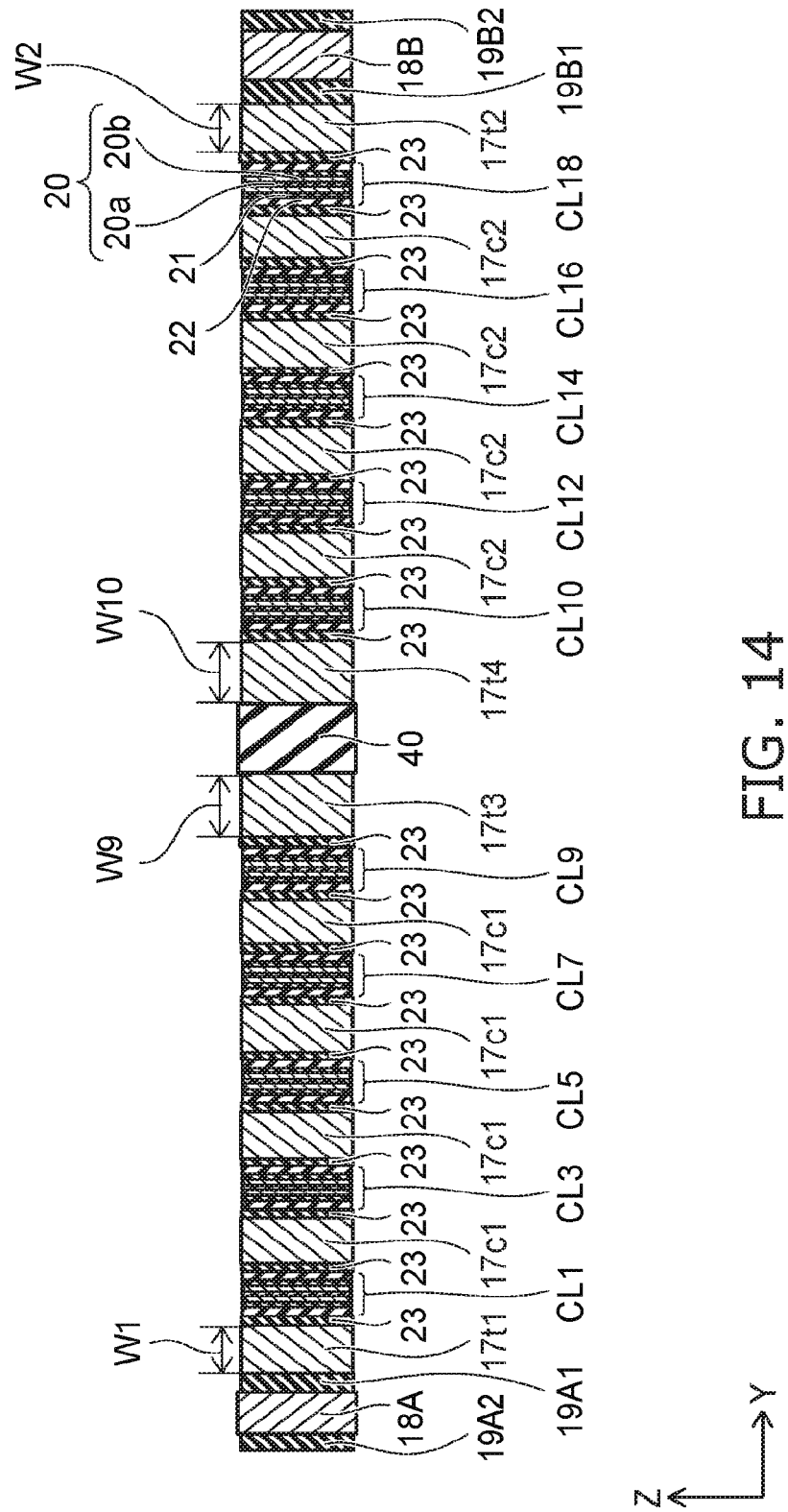
FIG. 14 is a cross-sectional view showing a part of the semiconductor memory device according to the second embodiment.

FIG. 13 is an enlarged plan view extracting the electrode layer 17 between the slits ST. FIG. 14 is a Y-Z cross-sectional view taken along a line B1-B2 of FIG. 13. For convenience of description, in FIG. 13, the hatching of a region representing the electrode layer 17 is omitted.

There is a difference in providing an insulating member 40 between a semiconductor memory device 2 according to the second embodiment and the semiconductor memory device 1 according to the first embodiment. Configurations other than the insulating member 40 in the second embodiment are the same as the first embodiment, and therefore, a detailed description of other configurations is omitted.

As shown in FIG. 13 and FIG. 14, the plurality of columnar portions CL are disposed between the slit ST1 and the slit ST2. In the electrode layer 17, a first row CLA1 to an eighteenth row CLA18 which are a row of columnar portions CL1 to a row of columnar portions CL18, respectively, are arranged along an extending direction (the X-direction) of the slits ST1 and ST2 or an extending direction (the X-direction) of the electrode layer 17 sandwiched between the slits ST1 and ST2. The columnar portions CL1 of the first row CLA1 to the columnar portions CL18 of the eighteenth row CLA18 are positioned on virtual straight lines D1 to D18 along the X-direction, respectively.

A slit ST4 extends in the Z-direction and the X-direction between a ninth row CLA9 and a tenth row CLA10. In the slit ST4, the plate-like insulating member 40 is provided. A bottom end of the insulating member 40 contacts the substrate 10. The insulating member 40 includes, for example, silicon oxide.

The columnar portions CL9 and CL10 on the straight lines D9 and D10 are positioned such that a distance in the Y-direction to the slit ST4 becomes shortest in the columnar portions CL1 to the columnar portions CL18. That is, in the drawing, the ninth row CLA9 and the tenth row CLA10 are rows of the columnar portions CL closest to the slit ST4. An end portion 17t1 of the electrode layer 17 is provided between the slit ST1 and the columnar portions CL1 of the first row CLA1. An end portion 17t2 of the electrode layer 17 is provided between the slit ST2 and the columnar portions CL18 of the eighteenth row CLA18. An end portion 17t3 of the electrode layer 17 is provided between the slit ST4 and the columnar portions CL9 of the ninth row CLA9. An end portion 17t4 of the electrode layer 17 is provided between the slit ST4 and the columnar portions CL10 of the tenth row CLA10.

As shown in FIG. 14, a central portion 17c1 is provided in the electrode layer 17 between the slits ST1 and ST4 so as to be sandwiched between the end portions 17t1 and 17t3. A central portion 17c2 is provided in the electrode layer 17 between the slits ST2 and ST4 so as to be sandwiched between the end portions 17t2 and 17t4.

The central portions 17c1, 17c2 and the end portions 17t1 to 17t4 of the electrode layer 17 are current paths.

A width W1 of the end portion 17t1 in the Y-direction is substantially the same as a width W2 of the end portion 17t2 in the Y-direction. A width W9 of the end portion 17t3 in the Y-direction is substantially the same as a width W10 of the end portion 17t4 in the Y-direction. The width W9 of the end portion 17t3 is greater than the width W1 of the end portion 17t1, and the width W10 of the end portion 17t4 is greater than the width W2 of the end portion 17t2.

The width W1 of the end portion 17t1 and the width W2 of the end portion 17t2 are 20 nanometers or less. The width W9 of the end portion 17t3 and the width W10 of the end portion 17t4 are greater than 20 nanometers. For example, when a width of the columnar portion CL is represented by Wc, the width W9 and the width W10 are greater than Wc/6.

By setting the width W9 greater than the width W1, a positional point P3 and a positional point P4 described later are not overlapped on the electrode layer 17. When a width of the electrode layer 17 in the Y-direction between the slits ST1 and ST4 (that is, a distance between the slits ST1 and ST4) is represented by W11, the positional point P3 is a point which is positioned in the middle (W11/2) of the width (the distance). When a maximum distance in the Y-direction from an end of the columnar portion CL1 to an end of the columnar portion CL9 is represented by d5, the positional point P4 is a point which is positioned at a distance of d5/2 from the columnar portion CL1 in the Y-direction. For example, a distance d6 between the positional point P3 and the positional point P4 is 20 nanometers or more.

By setting the width W10 greater than the width W2, a positional point P5 and a positional point P6 described later are not overlapped on the electrode layer 17. When a width of the electrode layer 17 in the Y-direction between the slits ST2 and ST4 (that is, a distance between the slits ST2 and ST4) is represented by W12, the positional point P5 is a point which is positioned in the middle (W12/2) of the width (the distance). When a maximum distance in the Y-direction from an end of the columnar portion CL10 to an end of the columnar portion CL18 is represented by d7, the positional point P6 is a point which is positioned at a distance of d7/2 from the columnar portion CL10 in the Y-direction. For example, a distance d8 between the positional point P5 and the positional point P6 is 20 nanometers or more.

When a distance between the columnar portions CL adjacent to each other at a shortest distance is represented by W13, the distance W13 is greater than the width W9 and the width W10.

Hereinafter, a method for manufacturing the semiconductor memory device 2 will be described.

Figure 15:
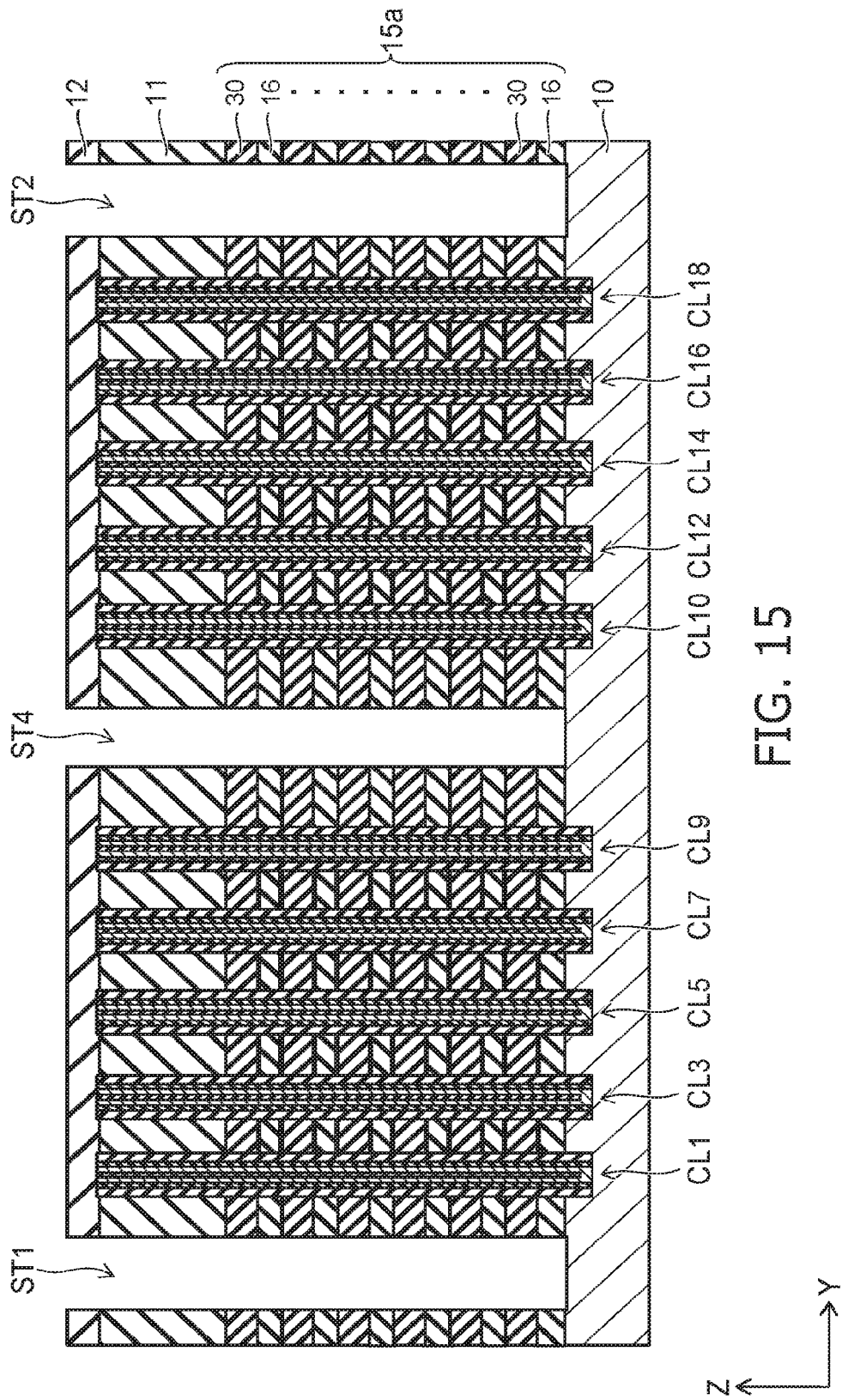
FIG. 15 to FIG. 17 are cross-sectional views showing a method for manufacturing the semiconductor memory device according to the second embodiment.
Figure 16:
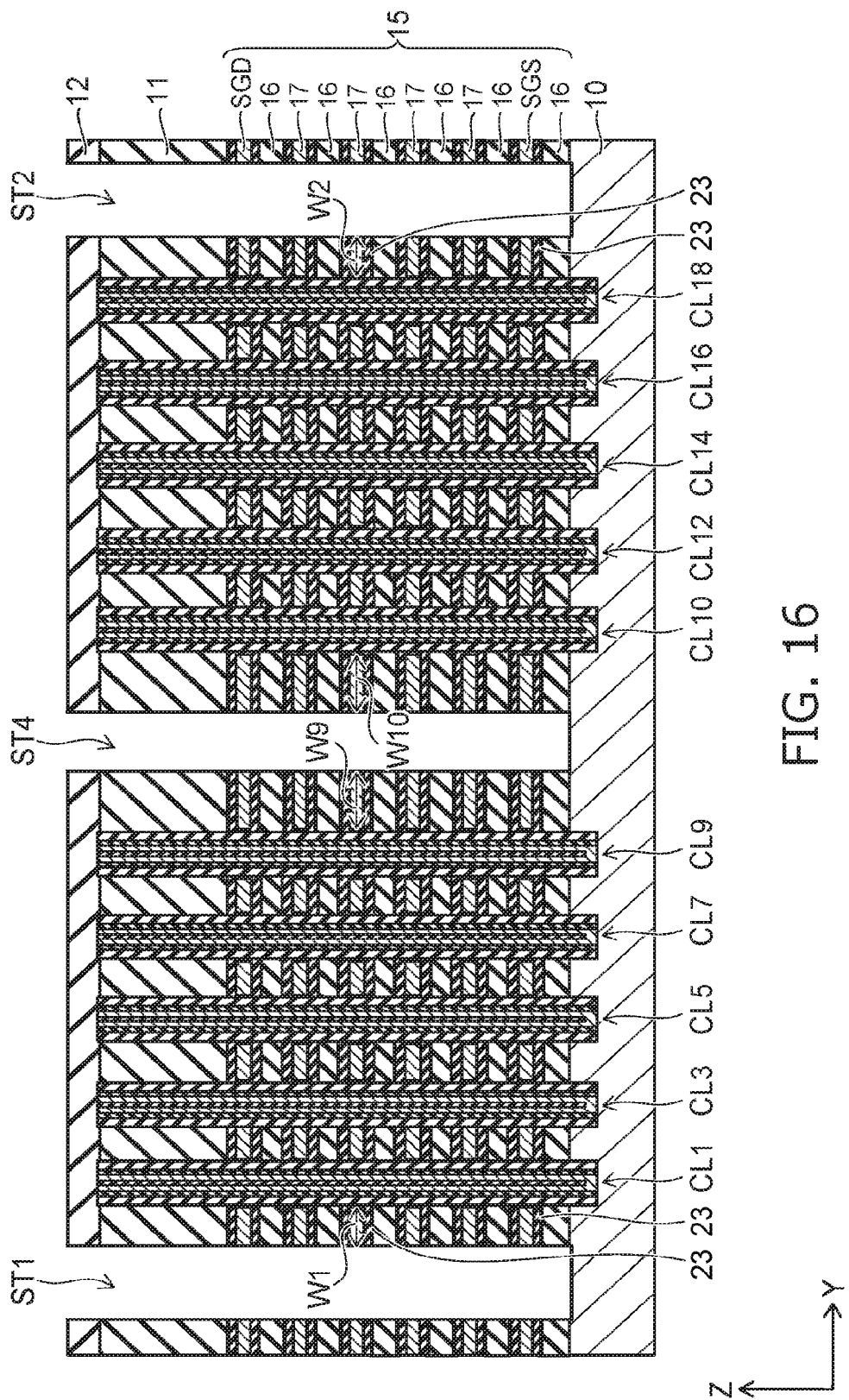
Figure 17:
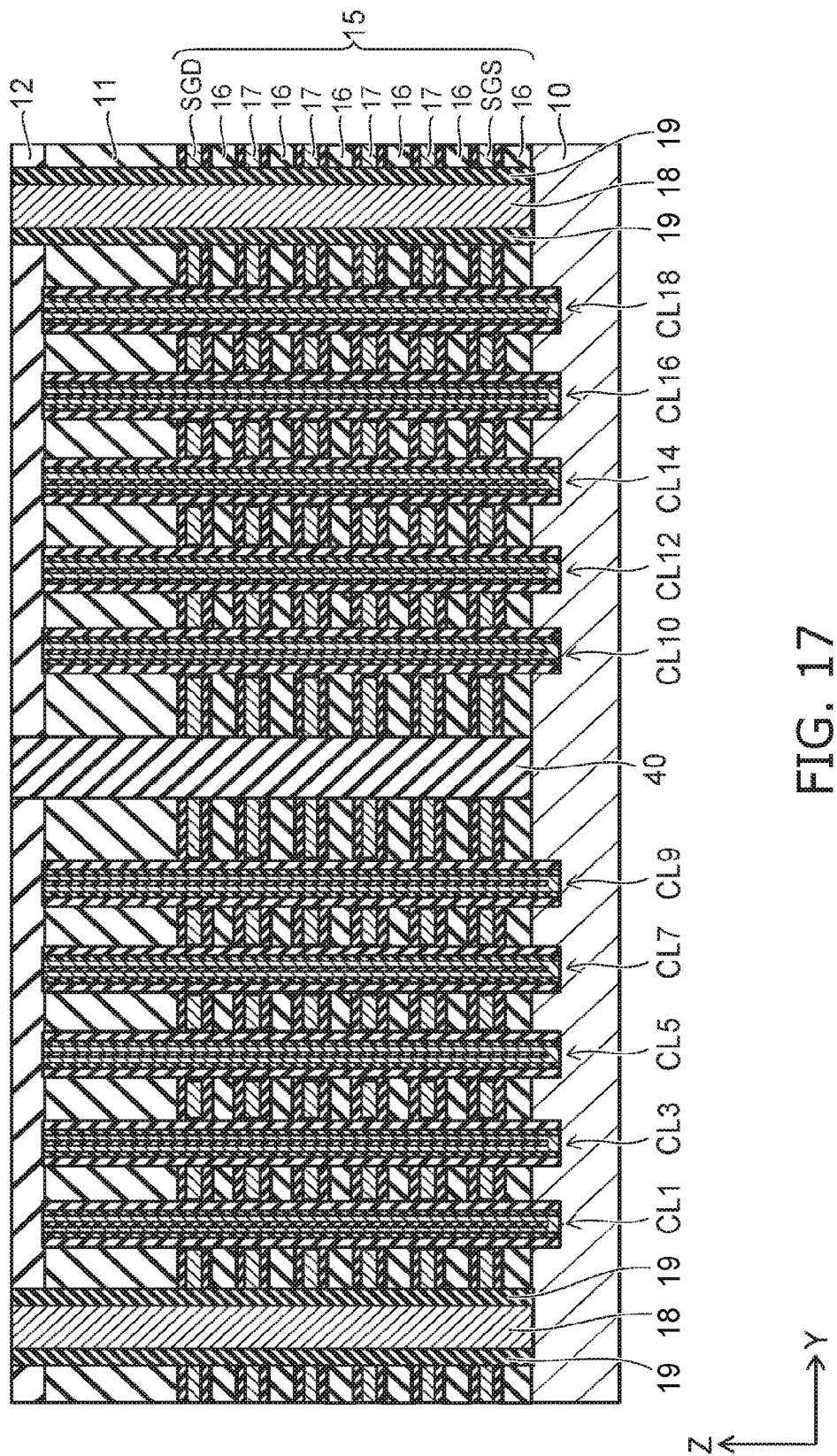

FIG. 15 to FIG. 17 are cross-sectional views showing a method for manufacturing the semiconductor memory device according to the second embodiment. There is a difference in forming the insulating member 40 between the method for manufacturing the semiconductor memory device of the second embodiment and the method for manufacturing the semiconductor memory device of the first embodiment. Therefore, since the second embodiment is the same as the first embodiment in the processes shown in FIG. 5 and FIG. 6, drawings and descriptions of the processes are omitted. The cross-sections of FIG. 15 to FIG. 17 correspond to the cross-sections of FIG. 7 to FIG. 9.

As shown in FIG. 15, the slits ST1, ST2 and ST4 extending in the X-direction are formed in the stacked body 15a by, for example, a photolithography method and an anisotropic etching such as the RIE or the like. The slit ST4 is formed in the Y-direction between the slits ST1 and ST2. The slit ST4 is pierced through the insulating film 11 and the stacked body 15a. In the case of arranging the first row CLA1 to the eighteenth row CLA18 which are the row of the columnar portions CL1 to the row of the columnar portions CL18, respectively, the columnar portions CL1, CL3, CL5, CL7 and CL9 are disposed from the slit ST1 toward the slit ST4 in the Y-Z cross-section shown in FIG. 15. Moreover, the columnar portions CL10, CL12, CL14, CL16 and CL18 are disposed from the slit ST4 toward the slit ST2.

Next, as shown in FIG. 16, the sacrifice films 30 are removed by performing a wet etching via the slits ST1, ST2 and ST4. Subsequently, the blocking insulating film 23 is formed around the charge storage film 22 and on the insulating layer 16. Thereafter, a metal such as tungsten or the like is deposited on the blocking insulating films 23 formed in the cavities 32 resulting from the removal of the sacrifice films 30 to form the electrode layer 17, the source side selection gate SGS and the drain side selection gate SGD. Thereby, the stacked body 15 is formed.

The width W9 of the electrode layer 17 in the Y-direction, which is positioned between the slit ST4 and the columnar portion CL9 is greater than the width W1 of the electrode layer 17 in the Y-direction, which is positioned between the slit ST1 and the columnar portion CL1. The width W10 of the electrode layer 17 in the Y-direction, which is positioned between the slit ST4 and the columnar portion CL10 is greater than the width W2 of the electrode layer 17 in the Y-direction, which is positioned between the slit ST2 and the columnar portion CL18.

Next, as shown in FIG. 17, by, for example, a CVD method, silicon oxide is deposited in the slits ST1, ST2 and ST4. Thereby, the insulating member 40 is formed in the slit ST4. Subsequently, the side walls 19 are formed by performing an etching-back of silicon oxide in the slits ST1 and ST2 so as to leave silicon oxide on the side surfaces of the slits ST1 and ST2. Thereafter, a metal such as tungsten or the like is deposited in the slits ST1 and ST2 to form the interconnection portions 18.

In this manner, the semiconductor memory device 2 according to the second embodiment is manufactured.

Hereinafter, the effects of the second embodiment will be described.

In the semiconductor memory device 2 of the second embodiment, the slits ST1, ST4 and ST2 are disposed in the order, and the plurality of columnar portions CL are disposed between the slits ST1 and ST4 so that the width W9 of the electrode layer 17 between the slit ST4 and the columnar portion CL9 having the shortest distance to the slit ST4 becomes greater than the width W1 of the electrode layer 17 between the slit ST1 and the columnar portion CL1 having the shortest distance to the slit ST1. Moreover, the plurality of columnar portions CL are disposed between the slits ST2 and ST4 so that the width W10 of the electrode layer 17 between the slit ST4 and the columnar portion CL10 having the shortest distance to the slit ST4 becomes greater than the width W2 of the electrode layer 17 between the slit ST2 and the columnar portion CL18 having the shortest distance to the slit ST2. When the plurality of columnar portions CL are provided such that the width W9 of the end portion 17t3 is greater than the width W1 of the end portion 17t1, and the width W10 of the end portion 17t4 is greater than the width W2 of the end portion 17t2, the rise of the resistivities of the end portions 17t3 and 17t4 is suppressed, and a flow of a current is made easier to the end portions 17t3 and 17t4. Therefore, a flow of a current is made easier to the electrode layer 17.

According to the second embodiment described above, the semiconductor memory device which suppresses problems from being generated in the operation of the memory cell can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a substrate;
   a stacked body including a plurality of insulating layers and a plurality of electrode layers alternately stacked one layer by one layer on the substrate;
   a plurality of columnar portions provided in the stacked body and extending in a stacking direction of the stacked body; and
   first and second interconnection portions provided in the stacked body, separated from each other, and extending in the stacking direction and a first direction crossing the stacking direction,
   the columnar portions being provided between the first and second interconnection portions and including a first row having a first columnar portion and a second row having a second columnar portion, the first columnar portion being positioned closest to the first interconnection portion, and the second columnar portion being positioned closest to the second interconnection portion, and
   a distance between the first interconnection portion and the first columnar portion being smaller than a distance between the second interconnection portion and the second columnar portion, and the distance between the second interconnection portion and the second columnar portion being greater than 20 nanometers.

2. The semiconductor memory device according to claim 1, wherein
   when virtual first and second positional points are set on each of the electrode layers, the first positional point is a point positioned in a middle of a distance between the first and second interconnection portions, and the second positional point is a point positioned in a middle of a distance from the first columnar portion to the second columnar portion, and
   the first positional point is positioned away 20 nanometers or more to the second positional point.

3. The semiconductor memory device according to claim 1, wherein the distance is a shortest distance between a block insulating film included into the columnar portion and the interconnection portion.

4. The semiconductor memory device according to claim 1, wherein the distance between the first interconnection portion and the first columnar portion is 20 nanometers or less.

5. The semiconductor memory device according to claim 1, further comprising:
   a third interconnection portion provided in the stacked body, the second interconnection portion being positioned between the first and third interconnection portions,
   wherein the columnar portions further include, between the second and third interconnection portions, a row that a third columnar portion is disposed and a row that a fourth columnar portion is disposed, the third columnar portion being positioned closest to the second interconnection portion, and the fourth columnar portion being positioned closest to the third interconnection portion, and
   a distance between the second interconnection portion and the third columnar portion is smaller than a distance between the third interconnection portion and the fourth columnar portion, and the distance between the third interconnection portion and the fourth columnar portion is greater than 20 nanometers.

6. The semiconductor memory device according to claim 1, wherein
   the electrode layers include a first end portion positioned between the first interconnection portion and the first columnar portion and a second end portion positioned between the second interconnection portion and the second columnar portion, and
   a width of the second end portion is greater than a width of the first end portion.

7. The semiconductor memory device according to claim 6, wherein the width of the second end portion is greater than ⅙ of a width of each columnar portion.

8. The semiconductor memory device according to claim 1, further comprising:
   a first insulating film provided between the stacked body and the first columnar portion;
   a second insulating film provided between the stacked body and the second columnar portion;
   a first side wall provided between the stacked body and the first interconnection portion; and
   a second side wall provided between the stacked body and the second interconnection portion, wherein a distance between the second insulating film and the second side wall is greater than a distance between the first insulating film and the first side wall.

9. The semiconductor memory device according to claim 8, wherein the first and second insulating films include one or more oxides selected from a group consisting of aluminum oxide, hafnium oxide, zirconium oxide, and tantalum oxide.

10. The semiconductor memory device according to claim 1, wherein the electrode layers include one or more metals selected from a group consisting of tungsten, titanium, tantalum, cobalt, and nickel.

11. The semiconductor memory device according to claim 1, wherein each of the columnar portions includes a semiconductor pillar and a charge storage film provided around the semiconductor pillar.

12. The semiconductor memory device according to claim 1, further comprising:
an insulating member provided in the stacked body, extending in the stacking direction and the first direction, and positioned between the first and second interconnection portions,
wherein the columnar portions further include a row that a fifth columnar portion is disposed between the first interconnection portion and the insulating member, the fifth columnar portion being positioned closest to the insulating member, and
a distance between the insulating member and the fifth columnar portion is greater than the distance between the first interconnection portion and the first columnar portion, and the distance between the insulating member and the fifth columnar portion is greater than 20 nanometers.

13. A semiconductor memory device comprising:
a substrate;
a stacked body including a plurality of insulating layers and a plurality of electrode layers alternately stacked one layer by one layer on the substrate;
a plurality of columnar portions provided in the stacked body and extending in a stacking direction of the stacked body; and
first and second interconnection portions provided in the stacked body and separated from each other, each of the first and second interconnection portions extending in the stacking direction and a first direction crossing the stacking direction, the first and second interconnection portions being disposed along a second direction crossing both the stacking direction and the first direction,
the columnar portions including a plurality of first columnar portions and a plurality of second columnar portions, the first and second columnar portions being provided between the first and second interconnection portions, the first columnar portions being positioned closest to the first interconnection portion, and the second columnar portions being positioned closest to the second interconnection portion,
when virtual first and second straight lines along the first direction are set on each of the electrode layers, the first columnar portions being positioned on the first straight line, and the second columnar portions being positioned on the second straight line,
when virtual first and second positional points along the second direction are set on each of the electrode layers, the first positional point being a point positioned in a middle of a distance between the first and second interconnection portions, and the second positional point being a point positioned in a middle of a distance between the first and second straight lines, and
the first positional point being positioned away 20 nanometers or more to the second positional point.

14. The semiconductor memory device according to claim 13, wherein
the electrode layers include a first end portion positioned between the first interconnection portion and the first columnar portions and a second end portion positioned between the second interconnection portion and the second columnar portions, and
a width of the second end portion in the second direction is greater than a width of the first end portion in the second direction, and the width of the second end portion in the second direction is greater than 20 nanometers.

15. The semiconductor memory device according to claim 14, wherein the width of the first end portion in the second direction is 20 nanometers or less.

16. The semiconductor memory device according to claim 13, further comprising:
a plurality of first insulating films provided between the stacked body and the first columnar portions;
a plurality of second insulating films provided between the stacked body and the second columnar portions;
a first side wall provided between the stacked body and the first interconnection portion; and
a second side wall provided between the stacked body and the second interconnection portion,
wherein each distance in the second direction between the second insulating films and the second side wall is greater than each distance in the second direction between the first insulating films and the first side wall.

17. The semiconductor memory device according to claim 13, wherein the electrode layers include one or more metals selected from a group consisting of tungsten, titanium, tantalum, cobalt, and nickel.

18. The semiconductor memory device according to claim 13, wherein each of the columnar portions includes a semiconductor pillar and a charge storage film provided around the semiconductor pillar.

19. The semiconductor memory device according to claim 13, further comprising:
an insulating member provided in the stacked body, extending in the stacking direction and the first direction, and positioned between the first and second interconnection portions; and
a first side wall provided between the stacked body and the first interconnection portion,
wherein the columnar portions further include a plurality of third columnar portions between the first interconnection portion and the insulating member, the third columnar portions being positioned closest to the insulating member,
when a virtual third straight line along the first direction are set on each of the electrode layers, the third columnar portions being positioned on the third straight line, and
when virtual third and fourth positional points along the second direction are set on each of the electrode layers, the third positional point is a point positioned in a middle of a distance between the first side wall and the insulating member, and the fourth positional point is a point positioned in a middle of a distance between the first and third straight lines, and
the third positional point being positioned away 20 nanometers or more to the fourth positional point.

20. A semiconductor memory device comprising:
a substrate;
a stacked body including a plurality of insulating layers and a plurality of electrode layers alternately stacked one layer by one layer on the substrate;
a plurality of columnar portions provided in the stacked body and extending in a stacking direction of the stacked body;
first and second interconnection portions provided in the stacked body, separated from each other, and extending in the stacking direction and a first direction crossing the stacking direction; and
an insulating member provided in the stacked body, extending in the stacking direction and the first direction, and positioned between the first and second interconnection portions,
the columnar portions including a row that a first columnar portion is disposed, a row that a second columnar portion is disposed, a row that a third columnar portion is disposed, and a row that a fourth columnar portion is disposed, the rows that the first and second columnar portions are disposed being provided between the first interconnection portion and the insulating member, the rows that the third and fourth columnar portions are disposed being provided between the second interconnection portion and the insulating member, the first columnar portion being positioned closest to the first interconnection portion, the second and fourth columnar portions being positioned closest to the insulating member, and the third columnar portion being positioned closest to the second interconnection portion,
a distance between the first interconnection portion and the first columnar portion being smaller than a distance between the insulating member and the second columnar portion, and the distance between the insulating member and the second columnar portion being greater than 20 nanometers, and
a distance between the second interconnection portion and the third columnar portion being smaller than a distance between the insulating member and the fourth columnar portion, and the distance between the insulating member and the fourth columnar portion being greater than 20 nanometers.

* * * * *